(12) United States Patent
Wang et al.

(10) Patent No.: US 10,811,627 B2
(45) Date of Patent: Oct. 20, 2020

(54) PIXEL DEFINING LAYER AND MANUFACTURING METHOD THEREOF, AND DISPLAY PANEL

(71) Applicant: BOE Technology Group Co., Ltd., Beijing (CN)

(72) Inventors: Dongfang Wang, Beijing (CN); Tongshang Su, Beijing (CN); Bin Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/539,123

(22) Filed: Aug. 13, 2019

(65) Prior Publication Data
US 2020/0058895 A1  Feb. 20, 2020

(30) Foreign Application Priority Data
Aug. 14, 2018 (CN) .......................... 2018 1 0920431

(51) Int. Cl.
*H01L 51/52* (2006.01)
*H01L 27/32* (2006.01)

(52) U.S. Cl.
CPC ........ *H01L 51/5221* (2013.01); *H01L 27/326* (2013.01); *H01L 51/5206* (2013.01); *H01L 2251/558* (2013.01)

(58) Field of Classification Search
CPC ............. H01L 51/5221; H01L 51/5206; H01L 27/326; H01L 2251/558; H01L 51/56; H01L 27/3276; H01L 27/3246
See application file for complete search history.

(56) References Cited

U.S. PATENT DOCUMENTS

2003/0184217 A1*  10/2003  Yamazaki ........... H01L 27/3276
                                                              313/505
2009/0009069 A1*  1/2009  Takata ................ H01L 27/3246
                                                              313/504
(Continued)

FOREIGN PATENT DOCUMENTS

CN       103413819 A      11/2013
CN       103416106 A      11/2013
(Continued)

OTHER PUBLICATIONS

First office action of Chinese application No. 201810920431.8 dated Dec. 24, 2019.
(Continued)

*Primary Examiner* — Karen Kusumakar
(74) *Attorney, Agent, or Firm* — Fay Sharpe LLP

(57) ABSTRACT

Disclosed are a pixel defining layer and a manufacturing method thereof, and a display panel, in the field of display technologies. An auxiliary electrode pattern is on a side of a substrate and configured to be electrically connected to a cathode in a display panel; and a first sub-defining layer is on a side of the auxiliary electrode pattern away from the substrate. A pixel defining layer has a plurality of openings, and the plurality of openings all pass through the auxiliary electrode pattern and the first sub-defining layer. The opening is configured to accommodate a material of a light emitting layer. An orthographic projection of the auxiliary electrode pattern on the substrate is within an orthographic projection of the first sub-defining layer on the substrate.

19 Claims, 20 Drawing Sheets

(56) References Cited

U.S. PATENT DOCUMENTS

| | | |
|---|---|---|
| 2009/0197407 A1 | 8/2009 | Bermann et al. |
| 2009/0295282 A1 | 12/2009 | Yoon et al. |
| 2012/0228592 A1 | 9/2012 | Yokoyama et al. |
| 2015/0194629 A1 | 7/2015 | Liu et al. |
| 2016/0351635 A1 | 12/2016 | Li |
| 2017/0125507 A1* | 5/2017 | Lee ................. H01L 27/3213 |
| 2017/0154934 A1* | 6/2017 | Kim ................. H01L 51/525 |
| 2019/0088728 A1 | 3/2019 | Wu et al. |

FOREIGN PATENT DOCUMENTS

| | | |
|---|---|---|
| CN | 104393192 A | 3/2015 |
| CN | 107611280 A | 1/2018 |
| JP | 2009289740 A | 12/2009 |

OTHER PUBLICATIONS

Second office action of Chinese application No. 201810920431.8 dated Jul. 16, 2020.

\* cited by examiner

PIXEL DEFINING LAYER AND MANUFACTURING METHOD THEREOF, AND DISPLAY PANEL

This application claims priority to Chinese Patent Application No.: 201810920431.8, filed on Aug. 14, 2018 and entitled "Manufacturing Method of Display Panel and Display Panel", the entire contents of which are incorporated herein by reference.

TECHNICAL FIELD

The present disclosure relates to the field of display technologies, and particularly to a pixel defining layer and a manufacturing method thereof, and a display panel.

BACKGROUND

At present, an organic light emitting diode (OLED) display device generally includes an anode layer, a light emitting layer and a cathode layer, etc. Depending on the position of a light emitting surface, display devices may be categorized into bottom-emitting-type OLED display devices and top-emitting-type OLED display devices. As the top-emitting-type OLED display device has a greater aperture ratio, this type of OLED display devices become a research focus.

The top-emitting-type OLED display device generally includes a thin and transparent cathode layer and an anode layer capable of reflecting light, to enhance light transmittance. The thin and transparent cathode layer generally has a big resistance value and a great voltage drop. Generally, in the cathode layer, the voltage drop is more apparent at a position farther from a power source, resulting in an obvious light emitting non-uniformity of the OLED display device.

To overcome the problem of severe voltage drop in the cathode layer in the OLED display device, an auxiliary electrode pattern and a conductive material layer need to be disposed in the display device. The auxiliary electrode pattern and the cathode may be electrically connected via a conductive material. After the power source provides electrical signals to the auxiliary electrode pattern, voltages at various positions in the cathode layer are the same by means of the electrical signals of the auxiliary electrode pattern and the conductive material.

SUMMARY

The embodiments of the present disclosure provide a pixel defining layer and a manufacturing method thereof, and a display panel. The technical solutions are as follows.

In an aspect, there is provided a pixel defining layer, comprising: an auxiliary electrode pattern, on a side of a substrate and configured to be electrically connected to a cathode in a display panel; and a first sub-defining layer on a side of the auxiliary electrode pattern away from the substrate; wherein the pixel defining layer has a plurality of openings, the plurality of openings all passing through the auxiliary electrode pattern and the first sub-defining layer, the openings being configured to accommodate a material of a light emitting layer, an orthographic projection of the auxiliary electrode pattern on the substrate being within an orthographic projection of the first sub-defining layer on the substrate.

Optionally, a side face of the auxiliary electrode pattern close to the openings is recessed along a direction away from the openings, such that the material of the light emitting layer is prevented from being in contact with the auxiliary electrode pattern during a process of manufacturing the light emitting layer.

Optionally, the side face of the auxiliary electrode pattern close to the openings is recessed to be in an arc shape along the direction away from the openings.

Optionally, in a direction of a contact surface between the auxiliary electrode pattern and the first sub-defining layer, a maximum distance from the side face of the auxiliary electrode pattern close to a side face of the first sub-defining layer close to the openings is 0.5~3 μm.

Optionally, the pixel defining layer further comprises: a second sub-defining layer, wherein the second sub-defining layer is between the substrate and the auxiliary electrode pattern, and the plurality of openings pass through the second sub-defining layer.

Optionally, the orthographic projection of the auxiliary electrode pattern and the orthographic projection of the first sub-defining layer on the substrate both are within an orthographic projection of the second sub-defining layer on the substrate.

Optionally, in a direction of a contact surface between the auxiliary electrode pattern and the second sub-defining layer, a maximum distance from a side face of the second sub-defining layer close to the openings to the side face of the auxiliary electrode pattern close to the opening is 0.5~3 μm.

Optionally, the second sub-defining layer has a thickness of 300~2000 nm, the auxiliary electrode pattern has a thickness of 10~700 nm, and the first sub-defining layer has a thickness of 300~2000 nm.

Optionally, a material of the auxiliary electrode pattern comprises a metal material.

In another aspect, there is provided a display panel, comprising a pixel defining layer; wherein the pixel defining layer comprises: an auxiliary electrode pattern, on a side of a substrate and configured to be electrically connected to a cathode in the display panel; and a first sub-defining layer on a side of the auxiliary electrode pattern away from the substrate; wherein the pixel defining layer has a plurality of openings, the plurality of openings all passing through the auxiliary electrode pattern and the first sub-defining layer, the openings being configured to accommodate a material of a light emitting layer, an orthographic projection of the auxiliary electrode pattern on the substrate being within an orthographic projection of the first sub-defining layer on the substrate; the display panel further comprising: a conductive material layer in at least one of the plurality of openings, the conductive material layer being electrically connected to the auxiliary electrode pattern.

Optionally, the display panel further comprises: a cathode, wherein the cathode is on a side of the first sub-defining layer and the conductive material layer away from the substrate, and the cathode is electrically connected to the conductive material layer.

Optionally, the display panel further comprises: a light emitting layer and anodes, wherein the light emitting layer is between the anodes and the conductive material layer.

Optionally, the anode is in the opening, and the anode is partially covered by the second sub-defining layer.

Optionally, the light emitting layer is not in contact with the auxiliary electrode pattern.

Optionally, a vertical distance from a surface of the light emitting layer away from a side of the substrate to the substrate is less than or equal to a vertical distance from a surface of the second sub-defining layer away from the side of the substrate to the substrate.

Optionally, a material of the conductive material layer comprises any one of organic conductive solvent doped with a metal material, and conductive ink.

In yet another aspect, there is provided a method of manufacturing a pixel defining layer, comprising: forming an auxiliary electrode pattern thin film on a side of a substrate; forming a first sub-defining layer thin film on a side of the auxiliary electrode pattern away from the substrate; and patterning the first sub-defining layer thin film and the auxiliary electrode pattern thin film to form an auxiliary electrode pattern and a first sub-defining layer, the auxiliary electrode pattern being configured to be electrically connected to a cathode in a display panel; wherein the pixel defining layer has a plurality of openings, the plurality of openings all passing through the auxiliary electrode pattern and the first sub-defining layer, the openings being configured to accommodate a material of a light emitting layer, an orthographic projection of the auxiliary electrode pattern on the substrate being within an orthographic projection of the first sub-defining layer on the substrate.

Optionally, patterning the first sub-defining layer thin film and the auxiliary electrode pattern thin film to form an auxiliary electrode pattern and a first sub-defining layer comprises: defining a photoresist thin film on a side of the first sub-defining layer thin film away from the substrate; patterning the photoresist thin film to form a photoresist pattern; performing a first etching on the first sub-defining layer thin film by using the photoresist pattern to form a first sub-defining layer whose surface is covered with the photoresist pattern; performing a second etching on the auxiliary electrode pattern thin film to form an auxiliary electrode pattern whose surface is covered with the photoresist pattern and the first sub-defining layer; and removing the photoresist pattern to obtain the auxiliary electrode pattern and the first sub-defining layer.

Optionally, a lateral etching strength of the second etching is greater than a lateral etching strength of the first etching.

Optionally, prior to forming an auxiliary electrode pattern thin film on a side of a substrate, the method further comprises: forming a second sub-defining layer thin film on a side of the substrate; forming an auxiliary electrode pattern thin film on a side of a substrate comprises: forming the auxiliary electrode pattern thin film on a side of the second sub-defining layer thin film away from the substrate; and patterning the first sub-defining layer thin film and the auxiliary electrode pattern thin film to form an auxiliary electrode pattern and a first sub-defining layer comprises: patterning the first sub-defining layer thin film, the auxiliary electrode pattern thin film and the second sub-defining layer thin film to form a second sub-defining layer, the auxiliary electrode pattern and the first sub-defining layer, such that the plurality of openings pass through the second sub-defining layer, the auxiliary electrode pattern and the first sub-defining layer.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The embodiments of the present disclosure will be described in further detail with reference to the accompanying drawings, to present the objects, technical solutions, and advantages of the present disclosure more clearly.

Figure 1:
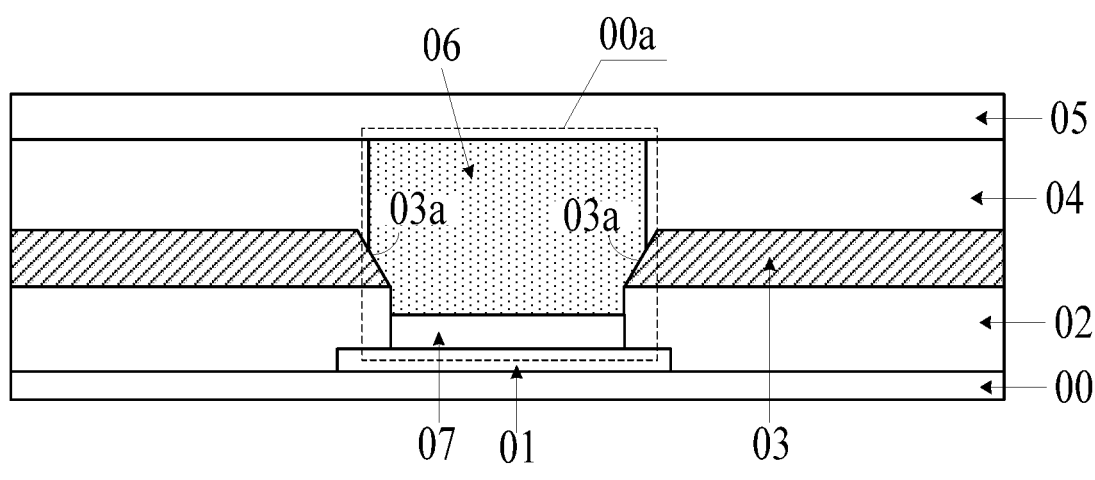
FIG. 1 is a schematic structural diagram of an OLED display device known to the inventors.

Referring to FIG. 1, FIG. 1 is a schematic structural diagram of an OLED display device known to the inventors. The OLED display device includes: a substrate 00. Anodes 01, a first pixel defining layer 02, an auxiliary electrode pattern 03, a second pixel defining layer 04 and a cathode 05 are on the substrate 00. The first pixel defining layer 02, the auxiliary electrode pattern 03 and the second pixel defining layer 04 may define a plurality of sub-pixel regions 00a arranged in an array. An organic light emitting layer 07 and a conductive material layer 06 are disposed in sequence in each sub-pixel region 00a.

The cathode 05 is electrically connected to the auxiliary electrode pattern 03 via the conductive material layer 06. When a power source provides an electrical signal for the auxiliary electrode pattern 03, the electrical signal may be transmitted into the cathode 05. As the auxiliary electrode pattern 03 is generally a grid-shaped pattern, voltages at various positions in the cathode 05 are approximately the same, and thus voltage drops at different positions of the cathode layer reduce, such that when electrical signals are applied to both the anodes 01 and the cathode 05, the organic light emitting layer 07 in different sub-pixel regions may normally emit light, which improves the light emitting uniformity of the OLED display device.

However, in the current manufacturing process, a longitudinal section of the formed auxiliary electrode pattern 03 is generally in a regular trapezoid shape. The longitudinal section is perpendicular to a light emitting surface of the OLED display device. As illustrated in FIG. 1, the longitudinal section is parallel to the paper. After the auxiliary electrode pattern 03 is manufactured, during forming the organic light emitting layer 07 by an evaporation process, a material used to form the organic light emitting layer 07 may be easily attached to a side face 03a of the auxiliary electrode pattern 03, which may hinder contact between the side face 03a of the auxiliary electrode pattern 03 and the conductive material layer 06. As a result, the electrical connection between the auxiliary electrode pattern 03 and the conductive material layer 06 is affected, thereby resulting in poor display effect of the OLED display device.

Figure 2:
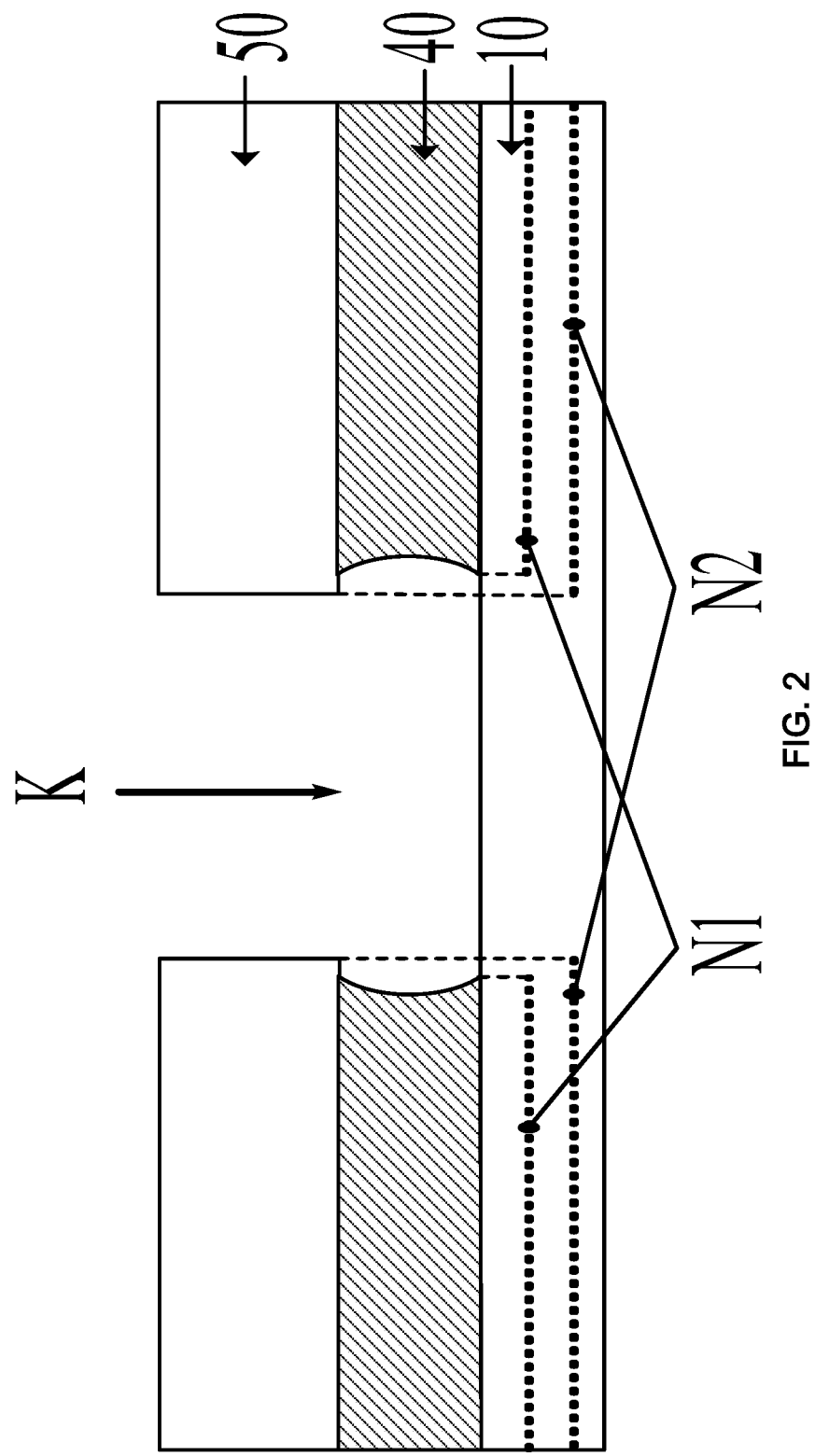
FIG. 2 is a schematic structural diagram of a pixel defining layer according to an embodiment of the present disclosure.

FIG. 2 is a schematic structural diagram of a pixel defining layer according to an embodiment of the present disclosure. As illustrated in FIG. 2, the pixel defining layer includes: an auxiliary electrode pattern 40, on a side of a substrate 10 and configured to be electrically connected to a cathode in a display panel; and a first sub-defining layer 50 on a side of the auxiliary electrode pattern 40 away from the substrate 10.

Figure 3:
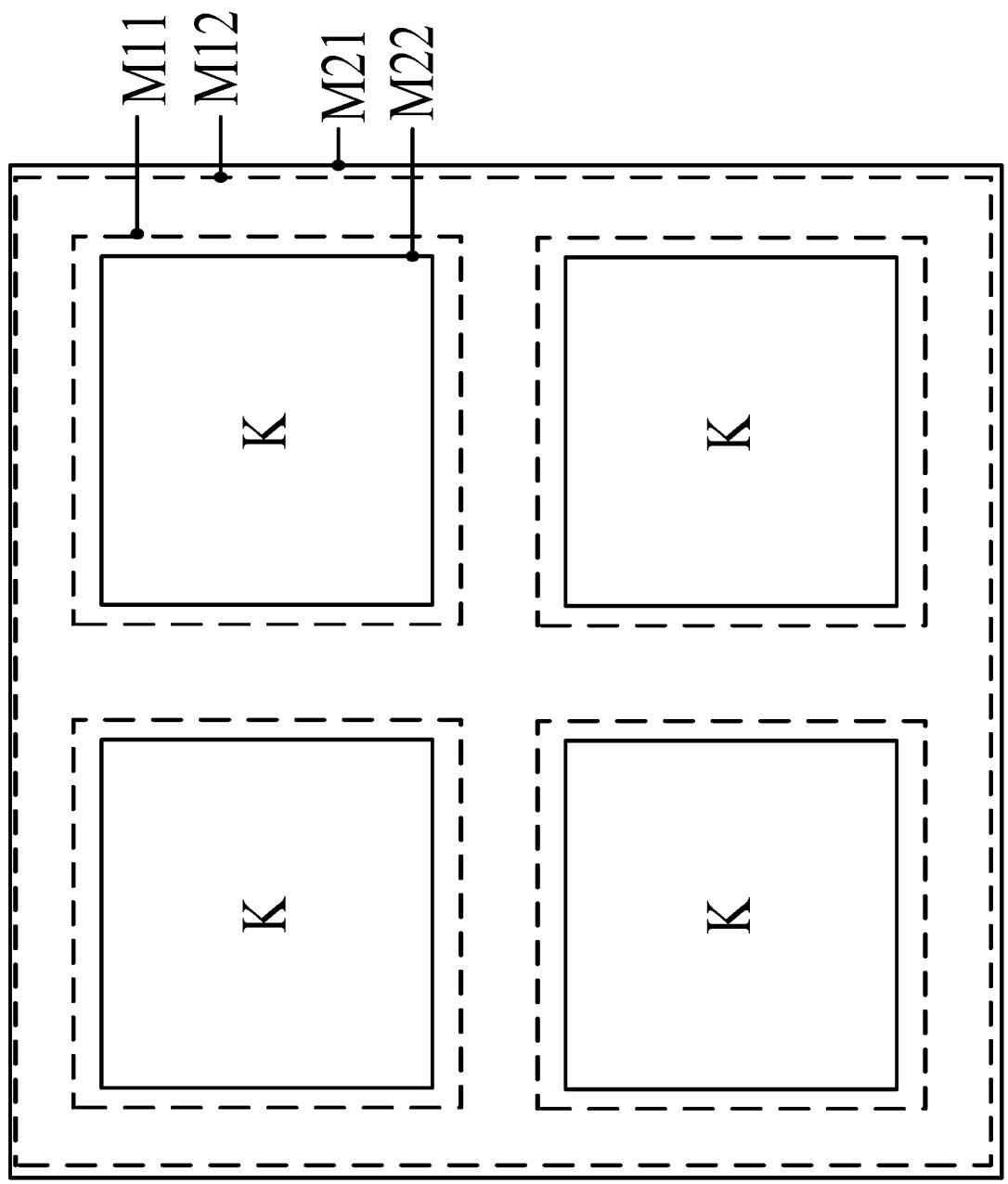
FIG. 3 is a schematic diagram of an orthographic projection of an auxiliary electrode pattern on a substrate, and an orthographic projection of a first sub-defining layer on the substrate according to an embodiment of the present disclosure.

The pixel defining layer has a plurality of openings K. The plurality of openings K all pass through the auxiliary electrode pattern 40 and the first sub-defining layer 50, and the opening K is configured to accommodate a material of a light emitting layer. An orthographic projection of the auxiliary electrode pattern 40 on the substrate 10 is within an orthographic projection of the first sub-defining layer 50 on the substrate 10. In FIG. 2, dotted lines N1 show an orthographic projection of a part of the auxiliary electrode pattern 40 on the substrate 10, and dotted lines N2 in FIG. 2 show an orthographic projection of a part of the first sub-defining layer 50 on the substrate 10. A pattern defined between dotted lines M11 and dotted lines M12 in FIG. 3 is the orthographic projection of the auxiliary electrode pattern 40 on the substrate 10, and a pattern defined between solid lines M21 and solid lines M22 in FIG. 3 is the orthographic projection of the first sub-defining layer 50 on the substrate 10.

In summary, a pixel defining layer is provided in the embodiment of the present disclosure. The pixel defining layer includes an auxiliary electrode pattern and a first sub-defining layer, and the pixel defining layer includes a plurality of openings. The plurality of openings all pass through the auxiliary electrode pattern and the first sub-defining layer, and the openings are configured to accommodate a material of a light emitting layer. In addition, the orthographic projection of the auxiliary electrode pattern on the substrate is within the orthographic projection of the first sub-defining layer on the substrate, such that when the light emitting layer is formed in the opening of the pixel defining layer, the first sub-defining layer can shield the auxiliary electrode pattern, to prevent the material of the light emitting layer from being attached to the auxiliary electrode pattern. Thus, the electrical connection performance between the auxiliary electrode pattern and the cathode is improved, and the display effect of the display panel manufactured by using the pixel defining layer is enhanced.

To further prevent the material of the light emitting layer from being attached to the auxiliary electrode pattern 40 during the process of manufacturing the light emitting layer, as illustrated in FIG. 2, the side face of the auxiliary electrode pattern 40 close to the opening K may be recessed along a direction away from the opening K. Exemplarily, as illustrated in FIG. 2, the side face of the auxiliary electrode pattern 40 close to the opening K is recessed to be in an arc shape along the direction away from the opening K.

Figure 4:
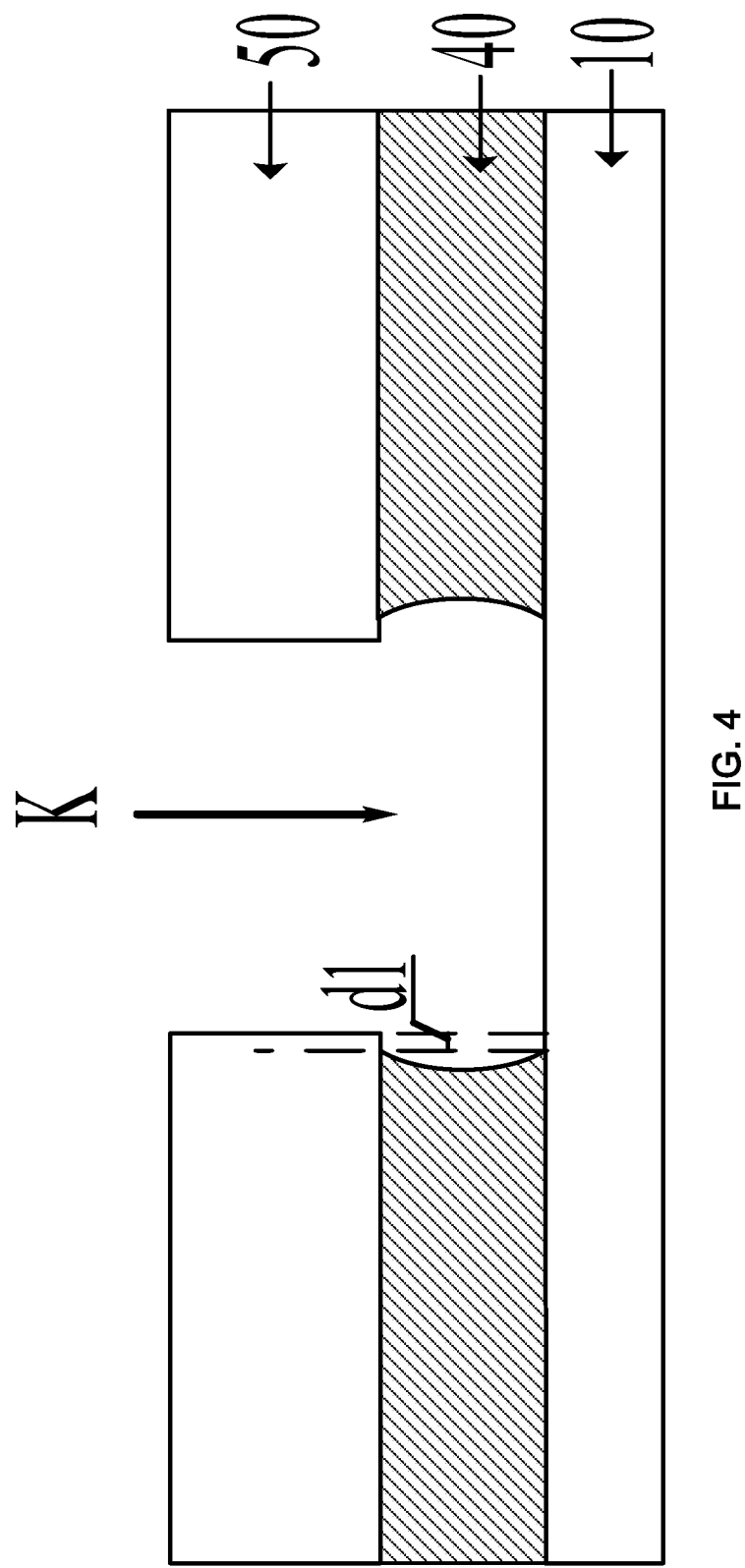
FIG. 4 is a schematic diagram of a distance from a side face of an auxiliary electrode pattern close to an opening to a side face of a first sub-defining layer close to the opening according to an embodiment of the present disclosure.

In addition, as illustrated in FIG. 4, along the direction of a contact surface between the auxiliary electrode pattern 40 and the first sub-defining layer 50, a maximum distance d1 from the side face of the auxiliary electrode pattern 40 close to the opening K to the side face of the first sub-defining layer 50 close to the opening K may be greater than 0. Exemplarily, the maximum distance d1 may be 0.5~3 µm.

Figure 5:
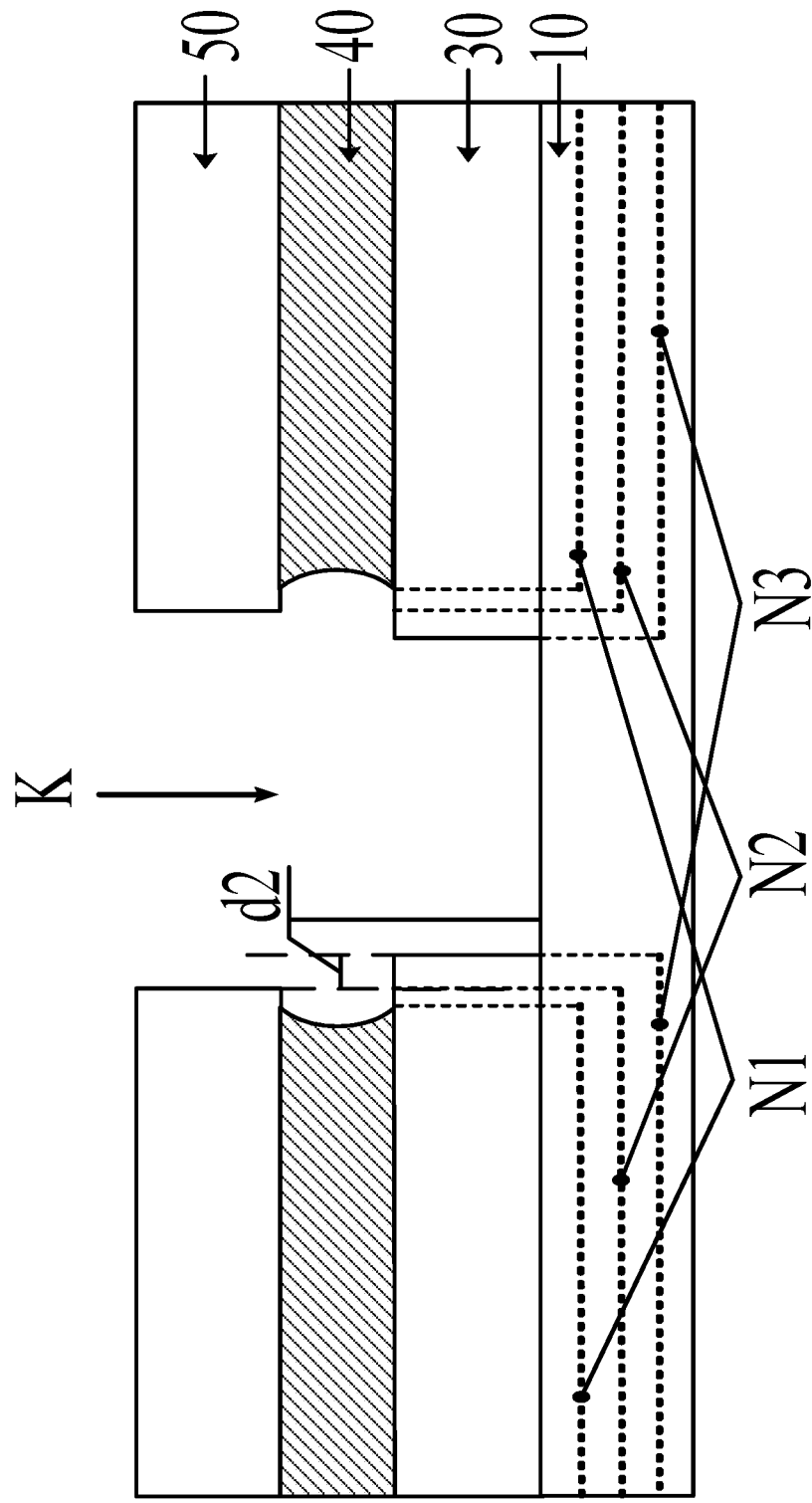
FIG. 5 is a schematic structural diagram of another pixel defining layer according to an embodiment of the present disclosure.

Optionally, as illustrated in FIG. 5, the pixel defining layer may further include a second sub-defining layer 30. The second sub-defining layer 30 is between the substrate 10 and the auxiliary electrode pattern 40, and the plurality of openings K pass through the second sub-defining layer 30.

Figure 6:
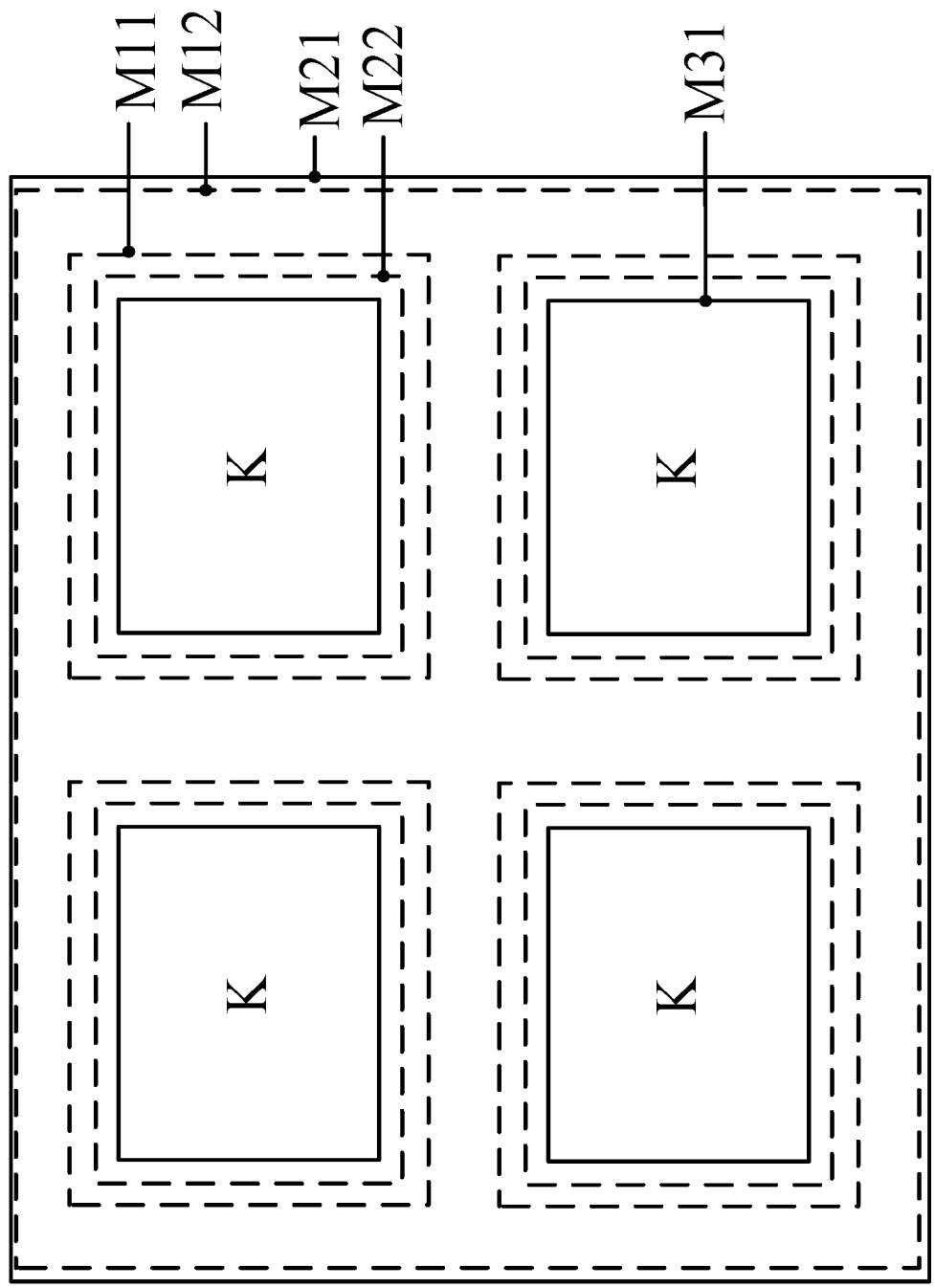
FIG. 6 is a schematic diagram of an orthographic projection of an auxiliary electrode pattern on a substrate, an orthographic projection of a first sub-defining layer on the substrate and an orthographic projection of a second sub-defining layer on the substrate according to an embodiment of the present disclosure.

In an implementation, as illustrated in FIG. 5 and FIG. 6, the second sub-defining layer 50 may be such disposed that the orthographic projection of the auxiliary electrode pattern 40 on the substrate 10 and the orthographic projection of the first sub-defining layer 50 on the substrate 10 both fall within the orthographic projection of the second sub-defining layer 30 on the substrate 10. Dotted lines N3 in FIG. 5 show the orthographic projection of the second sub-defining layer 30 on the substrate 10. The pattern defined by solid lines M21 and dotted lines M22 in FIG. 6 is the orthographic projection of the first sub-defining layer 30 on the substrate 10, and the pattern defined by the solid lines M21 and solid lines M31 in FIG. 6 is the orthographic projection of the second sub-defining layer 30 on the substrate 10.

In addition, as illustrated in FIG. 5, along the direction of a contact face between the auxiliary electrode pattern 40 and second first sub-defining layer 30, a maximum distance d2 from the side face of the second sub-defining layer 30 close to the opening K to the side face of the auxiliary electrode pattern 40 close to the opening K may be greater than 0. Exemplarily, the maximum distance d2 may be 0.5~3 µm.

Thicknesses of the second sub-defining layer 30, the auxiliary electrode pattern 40 and the first sub-defining layer 50 may be determined based on actual needs. For example, the second sub-defining layer 30 may have a thickness of 300~2000 nm, the auxiliary electrode pattern 40 may have a thickness of 10~700 nm, and the first sub-defining layer 50 may have a thickness of 300~2000 nm. In addition, materials of various film layers may also be determined based on actual needs. For example, the material of the auxiliary electrode pattern 40 may include a metal material. The material of the first sub-defining layer 50 may be an inorganic material, such as silicon oxide, silicon nitride or silicon oxynitride or the like.

In summary, a pixel defining layer is provided in the embodiment of the present disclosure. The pixel defining layer includes an auxiliary electrode pattern and a first sub-defining layer, and the pixel defining layer includes a plurality of openings. The plurality of openings all pass through the auxiliary electrode pattern and the first sub-defining layer, and the openings are configured to accommodate a material of a light emitting layer. In addition, the orthographic projection of the auxiliary electrode pattern on the substrate is within the orthographic projection of the first sub-defining layer on the substrate, such that when the light emitting layer is formed in the opening of the pixel defining layer, the first sub-defining layer can shield the auxiliary electrode pattern, to prevent the material of the light emitting layer from being attached to the auxiliary electrode pattern. Thus, the electrical connection performance between the auxiliary electrode pattern and the cathode is improved, and the display effect of the display panel manufactured by using the pixel defining layer is enhanced.

Figure 7:
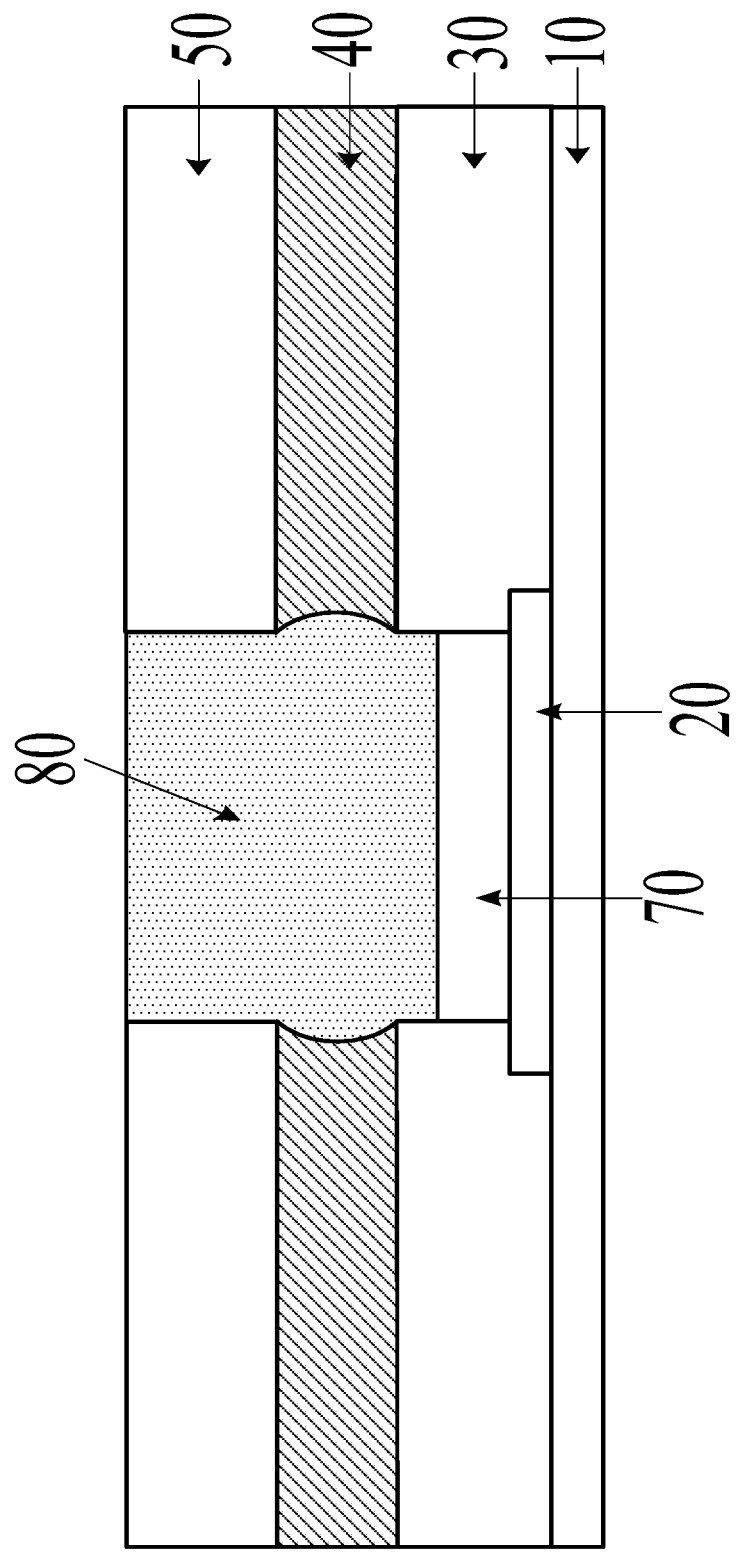
FIG. 7 is a schematic structural diagram of a display panel according to an embodiment of the present disclosure.

An embodiment of the present disclosure further provides a display panel. The display panel may include the pixel defining layer according to the embodiments of the present disclosure. In addition, as illustrated in FIG. 7, the display panel may further include a conductive material layer 80 in at least one of the plurality of openings K. The conductive material layer 80 is electrically connected to the auxiliary electrode pattern 40.

As illustrated in FIG. 7, the pixel defining layer may include: an auxiliary electrode pattern 40, on a side of a substrate 10 and configured to be electrically connected to a cathode 90 in a display panel; and a first sub-defining layer 50 on a side of the auxiliary electrode pattern 40 away from the substrate 10.

The pixel defining layer has a plurality of openings K. The plurality of openings K all pass through the auxiliary electrode pattern 40 and the first sub-defining layer 50, and the openings K are configured to accommodate a material of a light emitting layer. The orthographic projection of the auxiliary electrode pattern 40 on the substrate 10 is within the orthographic projection of the first sub-defining layer 50 on the substrate 10.

In summary, a display panel is provided in the embodiment of the present disclosure. The pixel defining layer in the display panel includes an auxiliary electrode pattern and a first sub-defining layer, and the pixel defining layer includes a plurality of openings. The plurality of openings all pass through the auxiliary electrode pattern and the first sub-defining layer, and the openings are configured to accommodate a material of a light emitting layer. In addition, the orthographic projection of the auxiliary electrode pattern on the substrate is within the orthographic projection of the first sub-defining layer on the substrate, such that when the light emitting layer is formed in the opening of the pixel defining layer, the first sub-defining layer can shield the auxiliary electrode pattern, to prevent the material of the light emitting layer from being attached to the auxiliary electrode pattern. Thus, the auxiliary electrode pattern can be electrically connected to the cathode well via the conductive material layer, which effectively enhances the display effect of the display panel manufactured by using the pixel defining layer.

The material of the conductive material layer 80 may include organic conductive solvent doped with a metal material, or conductive ink.

Figure 8:
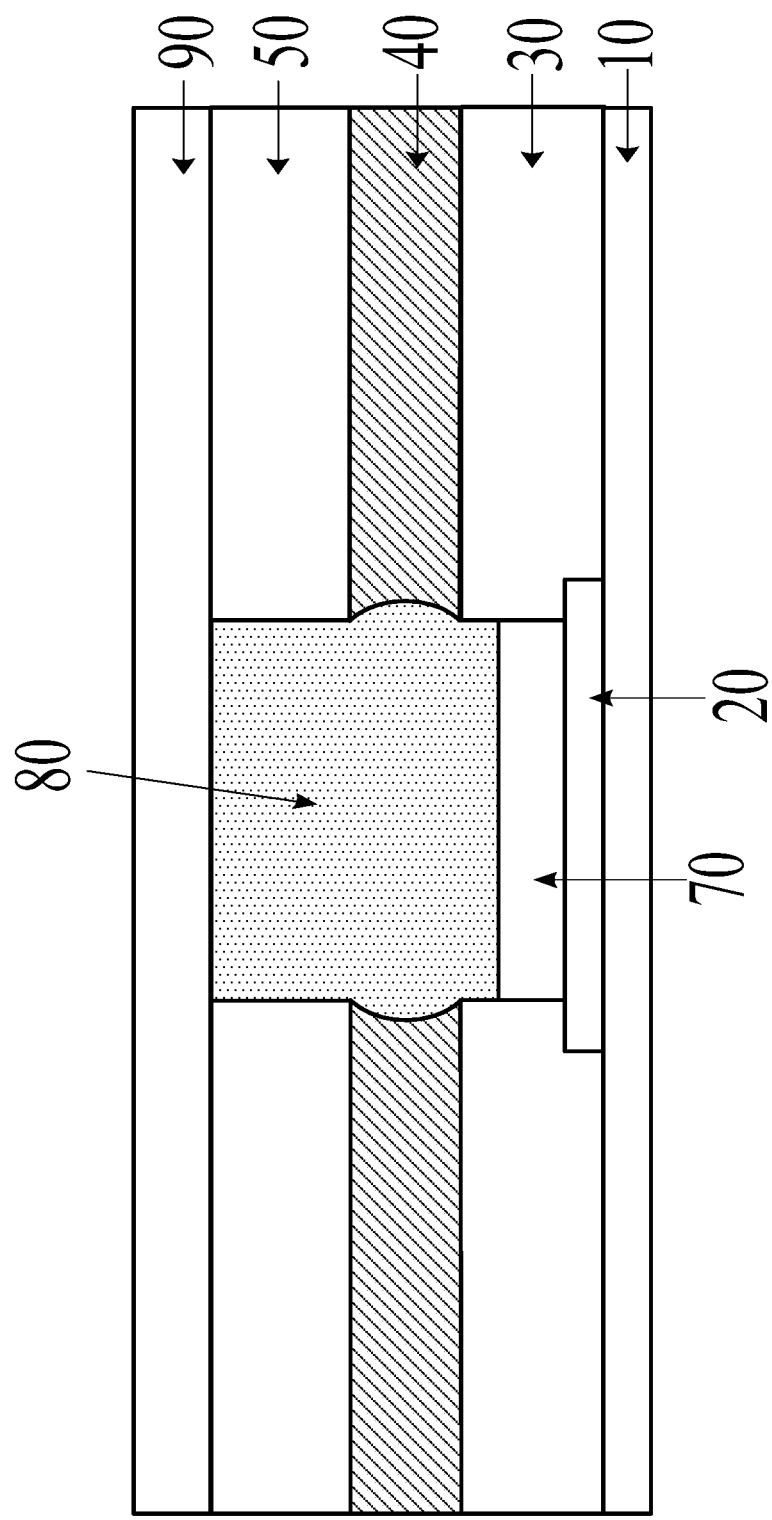
FIG. 8 is a schematic structural diagram of another display panel according to an embodiment of the present disclosure.

Optionally, as illustrated in FIG. 8, the display panel may further include a cathode 90. The cathode 90 is on a side of the first sub-defining layer 50 and the conductive material layer 80 away from the substrate 10, and the cathode 90 is electrically connected to the conductive material layer 80. Optionally, the material of the cathode 90 may include a transparent conductive material. For example, the transparent conductive material includes indium tin oxide (ITO).

In addition, as illustrated in FIG. 7 and FIG. 8, the display panel may further include a light emitting layer 70 and anodes 20. The light emitting layer 70 is between the anodes 20 and the conductive material layer 80. The light emitting layer 70 is not in contact with the auxiliary electrode pattern 40, and the vertical distance from a surface of the light emitting layer 70 away from a side of the substrate 10 to the substrate 10 may be less than or equal to the vertical distance from a surface of the second sub-defining layer 30 away from a side of the substrate 10 to the substrate 10. The material of the anode 20 may include a metal material having a high reflectivity. For example, the material of the anode 20 may be silver (Ag), titanium (Ti), copper (Cu), aluminum (Al) or an alloy material.

In an implementation, the anode 20 is in the opening, and a part of the anode 20 may be covered by the second sub-defining layer 30.

Optionally, the display panel may be any product or part with a display function, such as electronic paper, a mobile phone, a tablet computer, a television, a display, a laptop computer, a digital photo frame, a navigator or the like. Exemplarily, the display panel may be an OLED display panel.

In summary, a display panel is provided in the embodiment of the present disclosure. The pixel defining layer in the display panel includes an auxiliary electrode pattern and a first sub-defining layer, and the pixel defining layer includes a plurality of openings. The plurality of openings all pass through the auxiliary electrode pattern and the first sub-defining layer, and the openings are configured to accommodate a material of a light emitting layer. In addition, the orthographic projection of the auxiliary electrode pattern on the substrate is within the orthographic projection of the first sub-defining layer on the substrate, such that when the light emitting layer is formed in the opening of the pixel defining layer, the first sub-defining layer can shield the auxiliary electrode pattern, to prevent the material of the light emitting layer from being attached to the auxiliary electrode pattern. Thus, the auxiliary electrode pattern can be electrically connected to the cathode well via the conductive material layer, which effectively enhances the display effect of the display panel manufactured by using the pixel defining layer.

Figure 9:
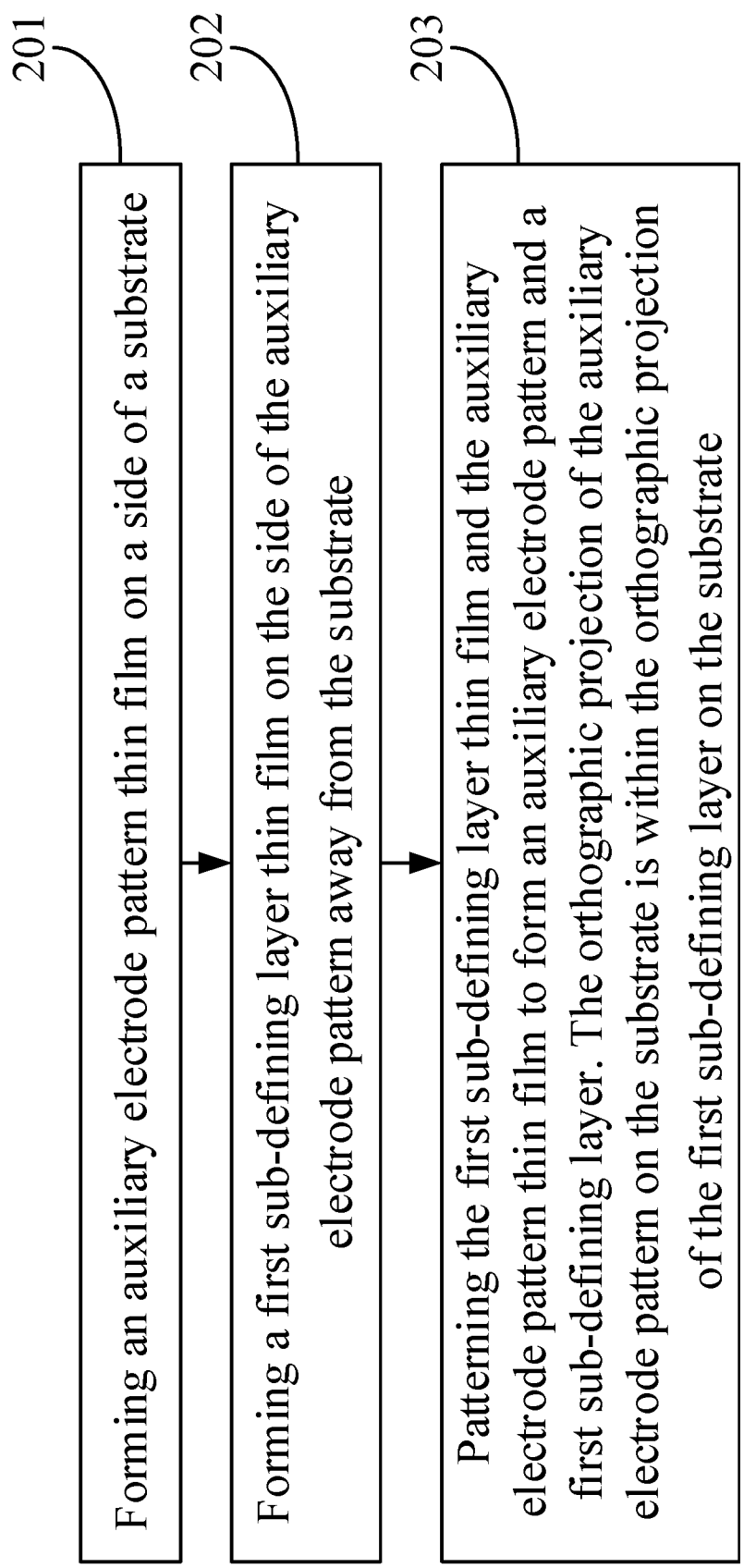
FIG. 9 is a flowchart of a method of manufacturing a pixel defining layer according to an embodiment of the present disclosure.

Referring to FIG. 9, FIG. 9 is a flowchart of a method of manufacturing a pixel defining layer according to an embodiment of the present disclosure. The method may include the following steps.

In step 201, an auxiliary electrode pattern thin film is formed on a side of a substrate.

In step 202, a first sub-defining layer thin film is formed on the side of the auxiliary electrode pattern away from the substrate.

In step 203, the first sub-defining layer thin film and the auxiliary electrode pattern thin film are patterned to form an auxiliary electrode pattern and a first sub-defining layer. The orthographic projection of the auxiliary electrode pattern on the substrate is within the orthographic projection of the first sub-defining layer on the substrate.

The auxiliary electrode pattern is configured to be electrically connected to a cathode in a display panel, and the pixel defining layer has a plurality of openings. The plurality of openings all pass through the auxiliary electrode pattern and the first sub-defining layer, and the openings are configured to accommodate a material of a light emitting layer.

In summary, according to the method of manufacturing a pixel defining layer provided in the embodiment of the present disclosure, by forming an auxiliary electrode pattern thin film and the first sub-defining layer thin film sequentially on the substrate, and patterning the first sub-defining layer thin film and the auxiliary electrode pattern thin film to obtain the auxiliary electrode pattern and the first sub-defining layer, the orthographic projection of the auxiliary electrode pattern on the substrate is within the orthographic projection of the first sub-defining layer on the substrate, such that when the light emitting layer is formed in the opening of the pixel defining layer, the first sub-defining layer can shield the auxiliary electrode pattern, to prevent the material of the light emitting layer from being attached to the auxiliary electrode pattern. Thus, electrical connection performance between the auxiliary electrode pattern and the cathode via the conductive material layer is improved, and the display effect of the display panel manufactured by using the pixel defining layer is enhanced.

Figure 10:
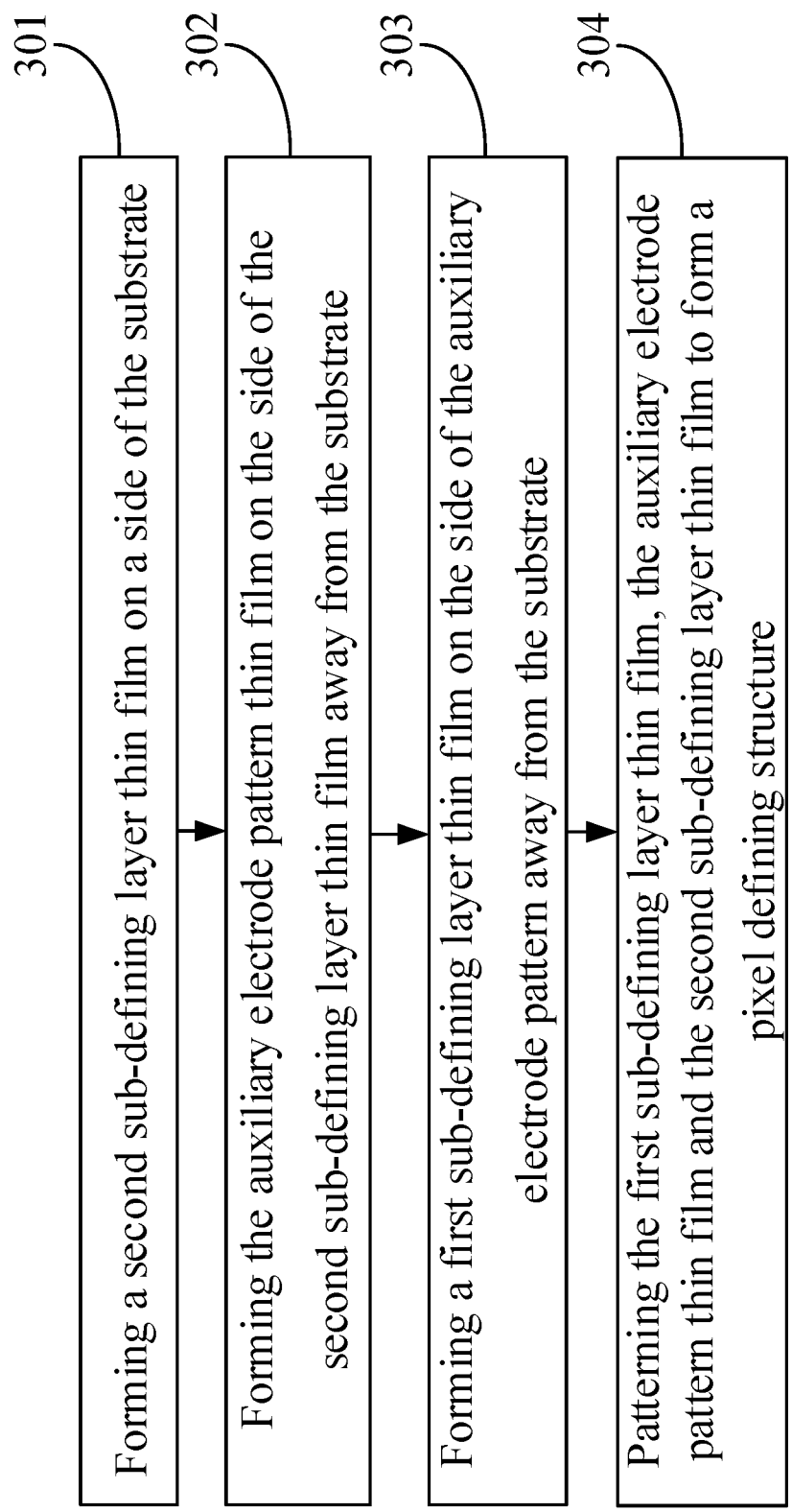
FIG. 10 is a flowchart of another method of manufacturing a pixel defining layer according to an embodiment of the present disclosure.

Referring to FIG. 10, FIG. 10 is a flowchart of another method of manufacturing a pixel defining layer according to an embodiment of the present disclosure. The method may include the following steps.

In step 301, a second sub-defining layer thin film is formed on a side of the substrate.

The second sub-defining layer thin film may be formed on the side of the substrate by any way of deposition, coating, sputtering and the like. The material of the second sub-defining layer thin film may be an inorganic material, such as silicon oxide, silicon nitride or silicon oxynitride. In addition, the thickness of the second sub-defining layer thin film may be set based on actual needs. For example, the second sub-defining layer thin film may have a thickness of 300~2000 nm.

In the embodiment of the present disclosure, the substrate may be a backplane having a plurality of thin film transistors (TFTs). The thin film transistor may include a gate electrode layer, a gate insulating layer, an active layer, an etching barrier layer, a source/drain electrode layer, a passivation layer and a light shielding film layer that are sequentially laminated on the substrate. Optionally, the TFT may be a top gate-type TFT, or may be a bottom gate-type TFT, which is not limited in the embodiments of the present disclosure.

In step 302, the auxiliary electrode pattern thin film is formed on the side of the second sub-defining layer thin film away from the substrate.

The auxiliary electrode pattern thin film may be formed by any means of deposition, coating, sputtering and the like on the substrate where the second sub-defining layer thin film is formed. The material of the auxiliary electrode pattern thin film may include a metal material. In addition, the thickness of the auxiliary electrode pattern thin film may be set based on actual needs. For example, the auxiliary electrode pattern thin film may have a thickness of 10~700 nm.

In step 303, a first sub-defining layer thin film is formed on the side of the auxiliary electrode pattern away from the substrate.

The first sub-defining layer thin film may be formed by any means of deposition, coating, sputtering and the like on the substrate where the auxiliary electrode pattern thin film is formed. The material of the first sub-defining layer thin film may be an inorganic material, such as silicon oxide, silicon nitride or silicon oxynitride. In addition, the thickness of the first sub-defining layer thin film may be set based on actual needs. For example, the first sub-defining layer thin film may have a thickness of 300~2000 nm.

Figure 11:
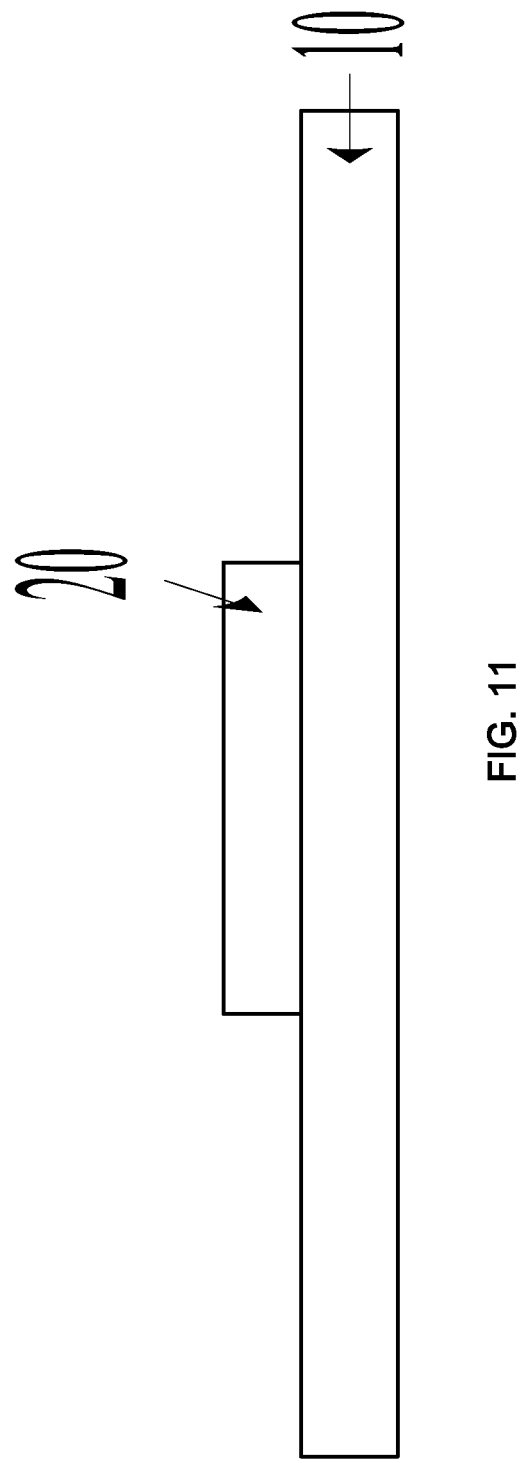
FIG. 11 is a schematic structural diagram of a substrate on which anodes are formed according to an embodiment of the present disclosure.
Figure 12:
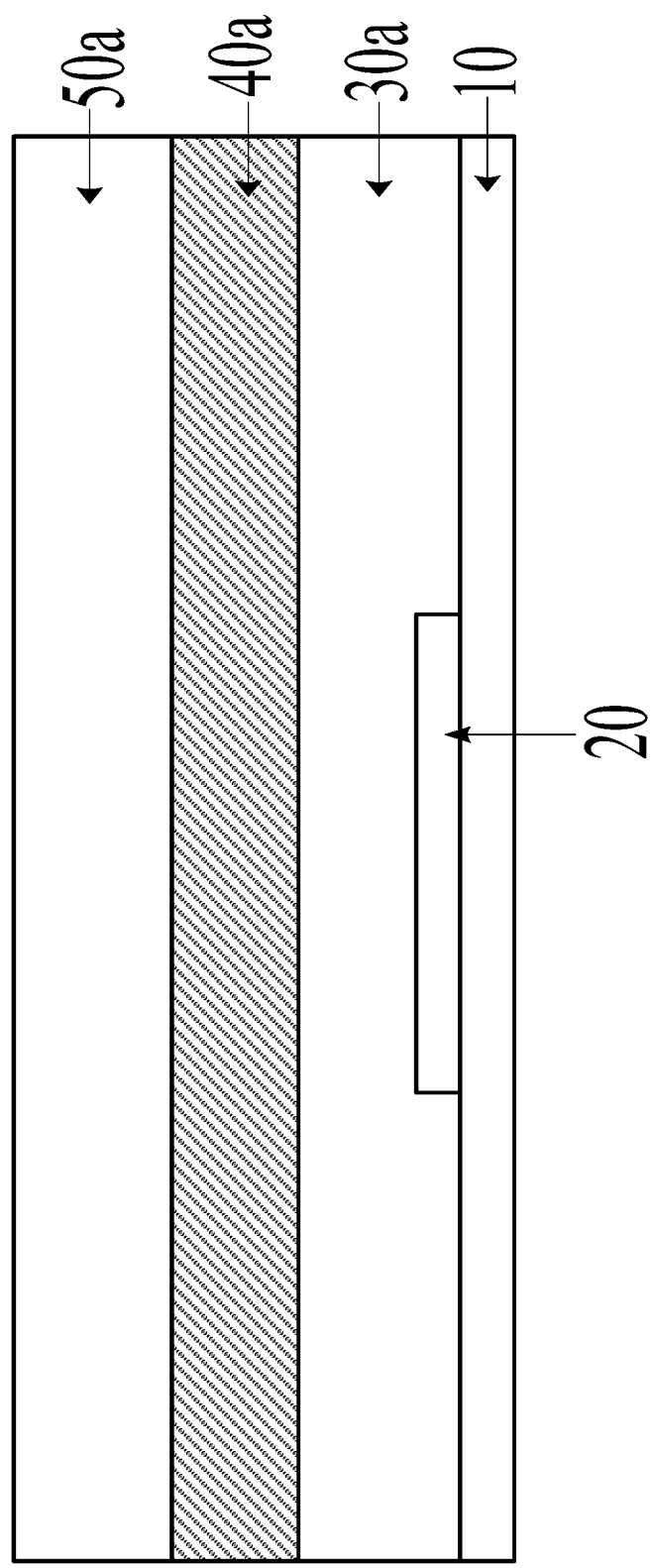
FIG. 12 is a schematic structural diagram after a second sub-defining layer thin film, an auxiliary electrode pattern thin film and a first sub-defining layer thin film are sequentially formed on the substrate where anodes are formed according to an embodiment of the present disclosure.

Exemplarily, the pixel defining layer is generally manufactured during the process of manufacturing the display panel. Therefore, in step 301, a second sub-defining layer thin film 30a may be formed on the substrate where the anodes are formed as illustrated in FIG. 11. Referring to FIG. 12, FIG. 12 is a schematic structural diagram after a second sub-defining layer thin film 30a, an auxiliary electrode pattern thin film 40a and a first sub-defining layer thin film 50a are sequentially formed on the substrate where anodes are formed according to an embodiment of the present disclosure.

In step 304, the first sub-defining layer thin film, the auxiliary electrode pattern thin film and the second sub-defining layer thin film are patterned to form a pixel defining structure.

In the embodiments of the present disclosure, the method of forming a pixel defining structure in step 304 may include the following steps.

In step 3041, a photoresist thin film is formed on a side of the first sub-defining layer thin film away from the substrate.

Figure 13:
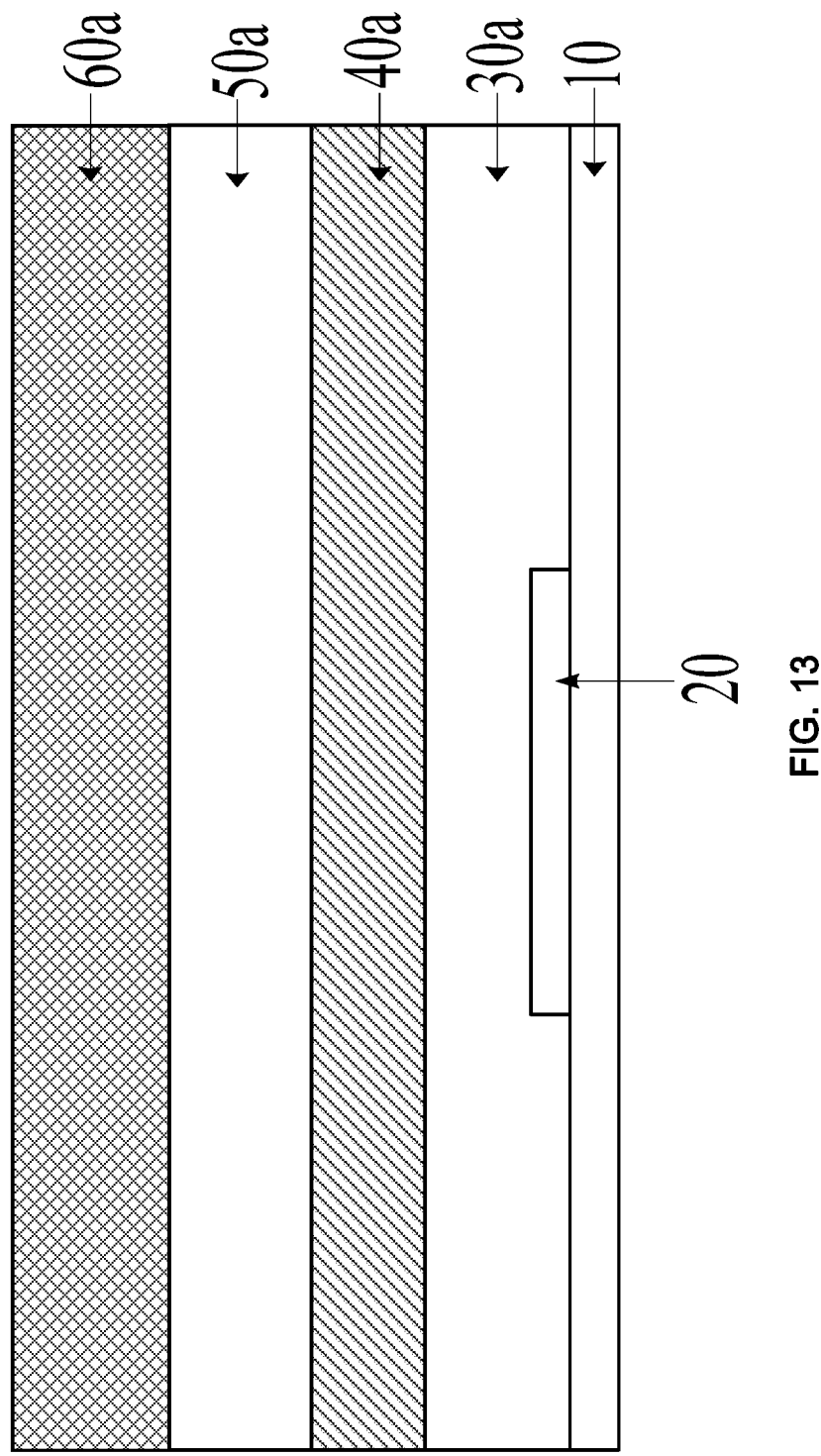
FIG. 13 is a schematic structural diagram of a pixel defining layer after a photoresist thin film is formed according to an embodiment of the present disclosure.

Optionally, a layer of photoresist thin film may be coated on a side of the first sub-defining layer thin film away from the substrate. The thickness of the photoresist thin film may be determined based on thicknesses of the second sub-defining layer thin film, the auxiliary electrode pattern thin film and the first sub-defining layer thin film. For example, when the second sub-defining layer thin film has a thickness of 300~2000 nm, the auxiliary electrode pattern thin film has a thickness of 10~700 nm and the first sub-defining layer thin film has a thickness of 300~2000 nm, the photoresist thin film may have a thickness of 2~5 μm. The material of the photoresist thin film may be a positive photoresist material, or may be a negative photoresist material. Exemplarily, referring to FIG. 13, FIG. 13 is a schematic structural diagram after a photoresist thin film 60a is formed according to an embodiment of the present disclosure.

In step 3042, the photoresist thin film is patterned to form a photoresist pattern.

Figure 14:
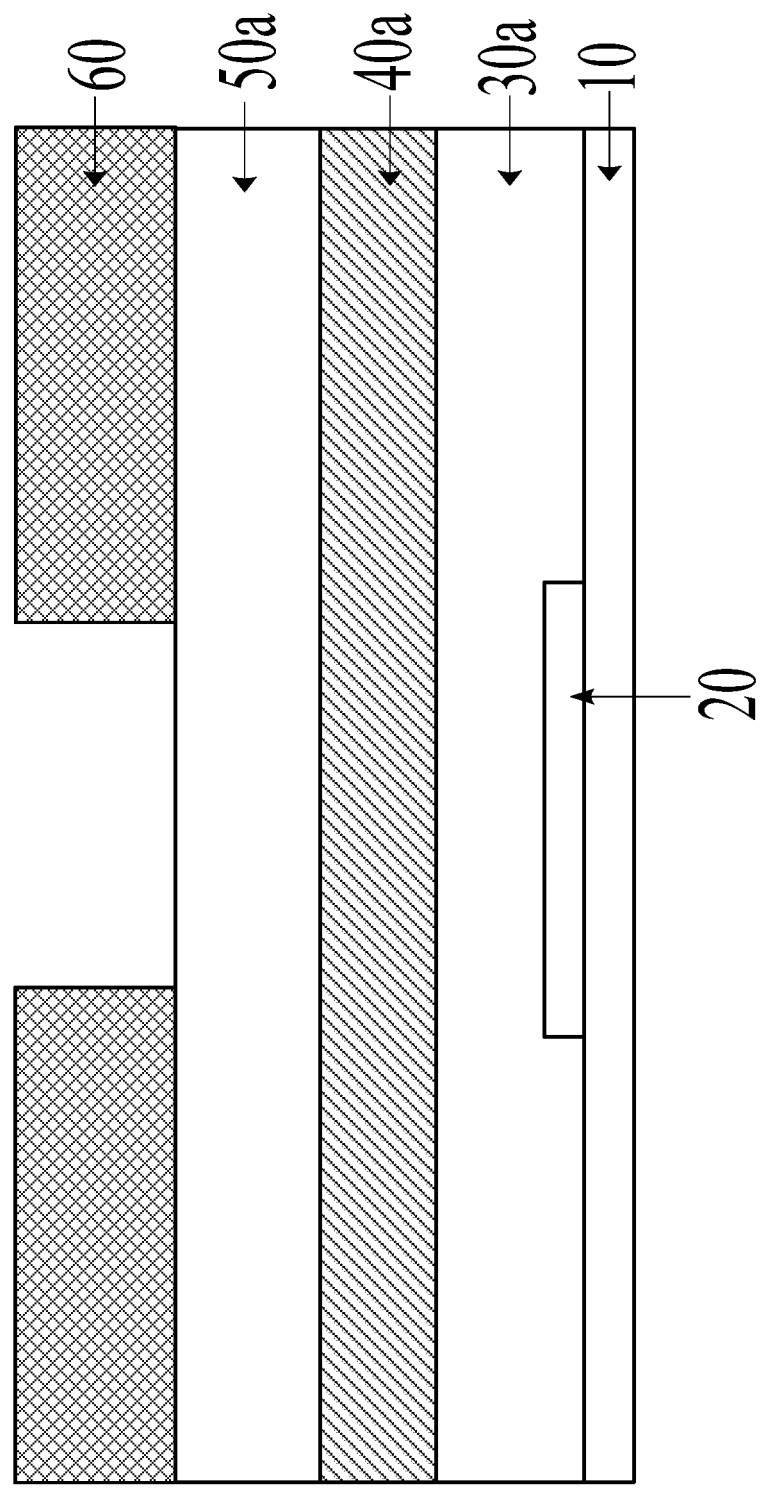
FIG. 14 is a schematic structural diagram of a pixel defining layer after a photoresist pattern is formed according to an embodiment of the present disclosure.

Exemplarily, exposure and developing may be performed on the photoresist thin film to form the photoresist pattern. Referring to FIG. 14, FIG. 14 is a schematic structural diagram after a photoresist pattern 60 is formed according to an embodiment of the present disclosure.

It should be noted that the photoresist thin film may have a thickness of 2~5 μm. In this case, the thickness of the photoresist thin film is big. After exposure and developing are performed on the photoresist thin film, a longitudinal section of the formed photoresist pattern may be enabled to be in a rectangular shape or an approximate rectangular shape, to reduce the probability that the regular trapezoid shape of longitudinal section of the pattern formed after etching is performed based on the photoresist pattern subsequently.

In step 3043, a first etching is performed on the first sub-defining layer thin film by using the photoresist pattern to form a first sub-defining layer whose is covered with the photoresist pattern.

Figure 15:
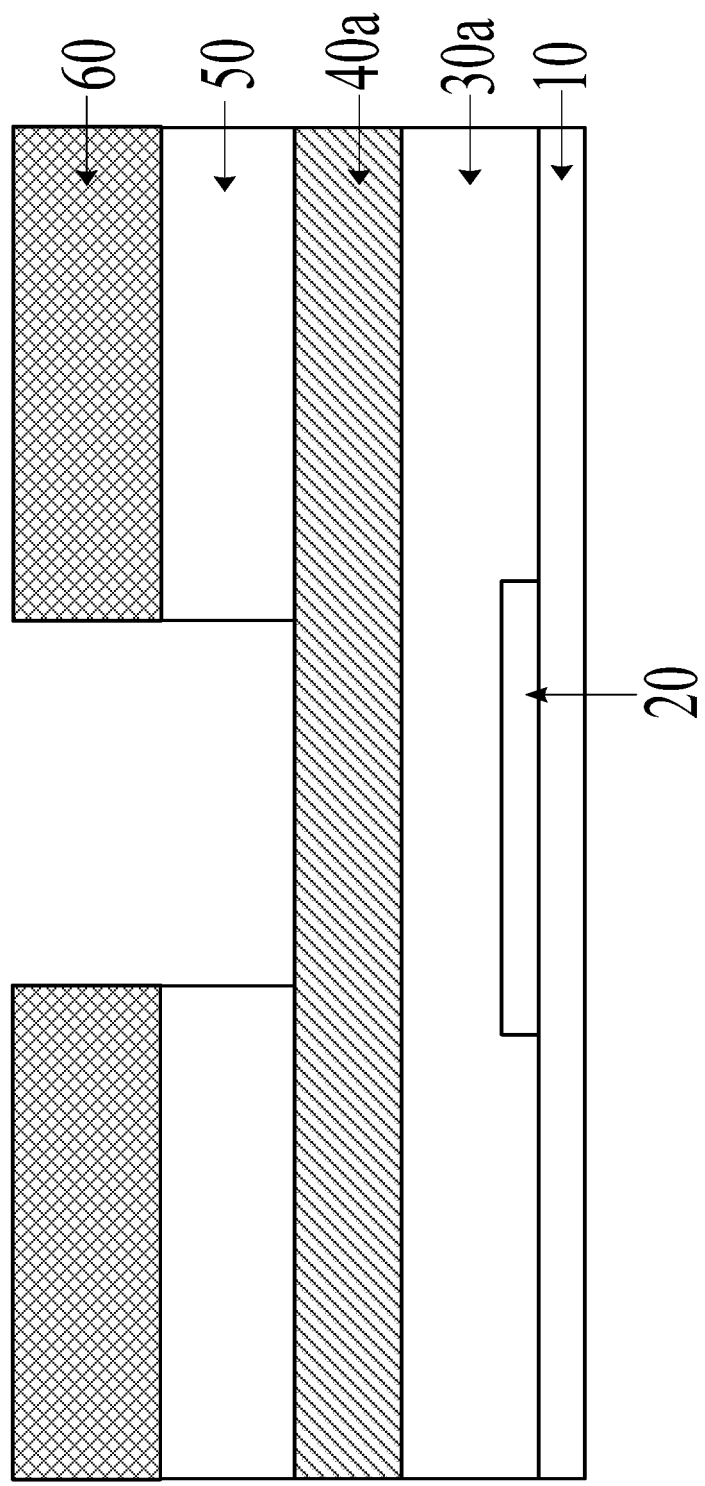
FIG. 15 is a schematic structural diagram after a first sub-defining layer is formed according to an embodiment of the present disclosure.

The first etching may be performed on the first sub-defining layer thin film to form a first sub-defining layer. A surface of the first sub-defining layer away from a side of the substrate is covered by a photoresist pattern, and a plurality of openings are formed in the first sub-defining layer. The plurality of openings all pass through the first sub-defining layer. Exemplarily, referring to FIG. 15, FIG. 15 is a schematic structural diagram after a first sub-defining layer 50 is formed according to an embodiment of the present disclosure. The surface of the first sub-defining layer 50 away from a side of the substrate is covered by a photoresist pattern 60, and the first sub-defining layer has a plurality of openings. The plurality of openings all pass through the first sub-defining layer.

Optionally, the first etching may be dry etching. Since the lateral etching strength of the dry etching is smaller than the lateral etching strength of the wet etching, after the first sub-defining layer is formed by the dry etching, the opening defined by the first sub-defining layer has a small area, such that the number of pixels per inch (PPI) of the display panel formed in the opening is great, which is favorable to improvement of the resolution of the display device.

In step 3044, a second etching is performed on the auxiliary electrode pattern thin film to form an auxiliary electrode pattern whose surface is covered with the photoresist pattern and the first sub-defining layer.

Figure 16:
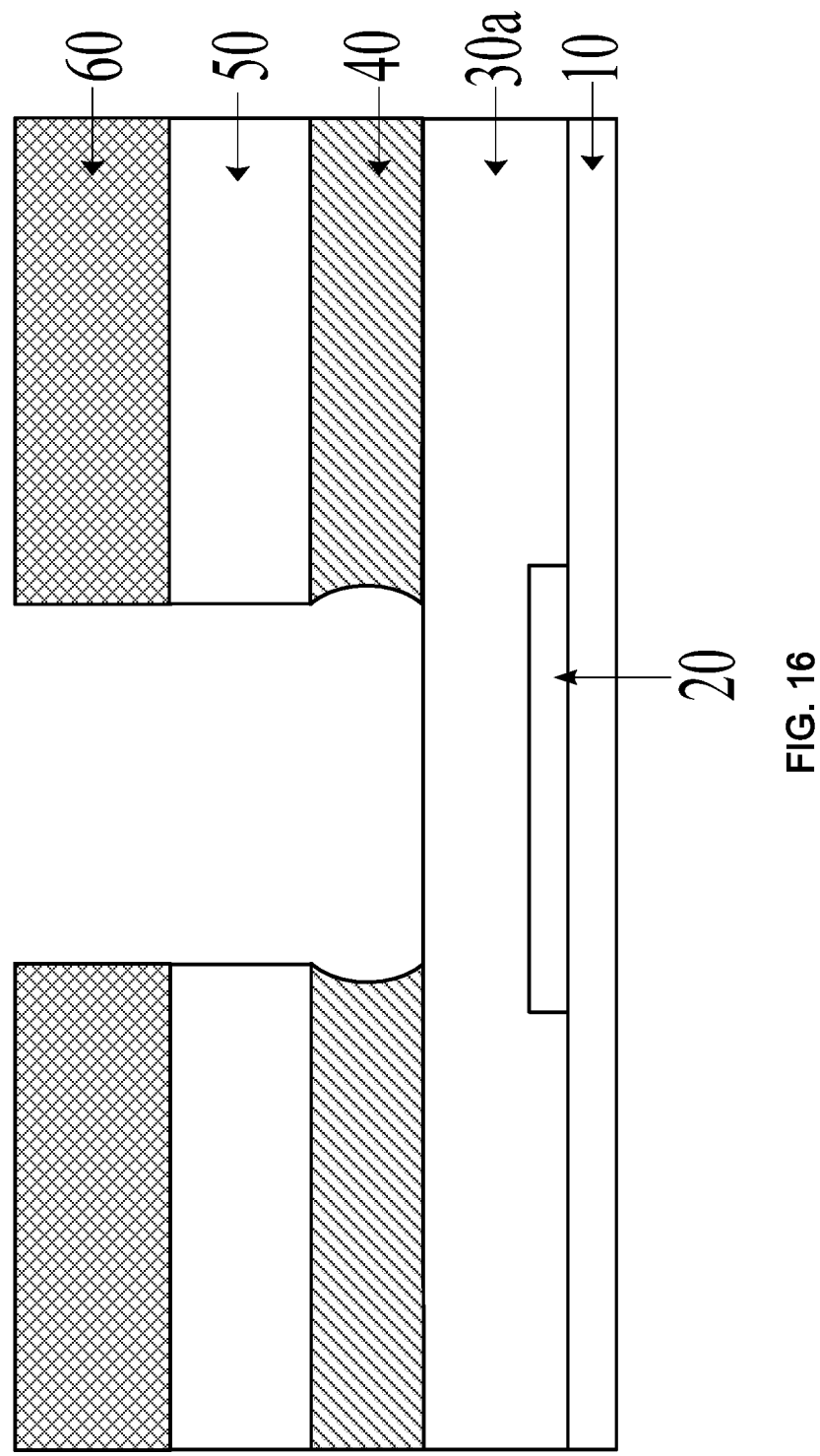
FIG. 16 is a schematic structural diagram after an auxiliary electrode pattern is formed according to an embodiment of the present disclosure.

The second etching may be performed on the auxiliary electrode pattern thin film to form an auxiliary electrode pattern. The surface of the auxiliary electrode pattern away from a side of the substrate is covered by the photoresist pattern and the first sub-defining layer, and a plurality of openings are formed in the auxiliary electrode pattern. The plurality of openings all pass through the auxiliary electrode pattern, and the openings formed on the auxiliary electrode pattern pass through the openings formed on the first sub-defining layer in a one-to-one correspondence. Exemplarily, referring to FIG. 16, FIG. 16 is a schematic structural diagram after an auxiliary electrode pattern 40 is formed according to an embodiment of the present disclosure. The surface of the auxiliary electrode pattern 40 away from a side of the substrate 10 is covered by a first sub-defining layer 50 and a photoresist pattern 60 in sequence, and openings formed on the auxiliary electrode pattern 40 pass through the openings formed on the first sub-defining layer 50.

The lateral etching strength of the second etching is greater than the lateral etching strength of the first etching. Optionally, the second etching may be a wet etching. As the lateral etching strength of the wet etching is greater than the lateral etching strength of the dry etching, and the material of the auxiliary electrode pattern thin film includes a metal material having a great lateral etching rate, after the auxiliary electrode pattern 40 is formed by the wet etching, the orthographic projection of the auxiliary electrode pattern on the substrate is within the orthographic projection of the first sub-defining layer on the substrate.

In addition, a side face of the auxiliary electrode pattern 40 close to the opening may be recessed along the direction away from the opening. That is, relative to the side face of the first sub-defining layer 50 close to the opening, the side face of the auxiliary electrode pattern 40 close to the opening is recessed along the direction away from the opening, to prevent such the material of the light emitting layer from being in contact with the auxiliary electrode pattern during the process of manufacturing the light emitting layer in the opening. Exemplarily, the side face of the auxiliary electrode pattern close to the opening may be recessed to be in an arc shape along the direction away from the opening.

Figure 17:
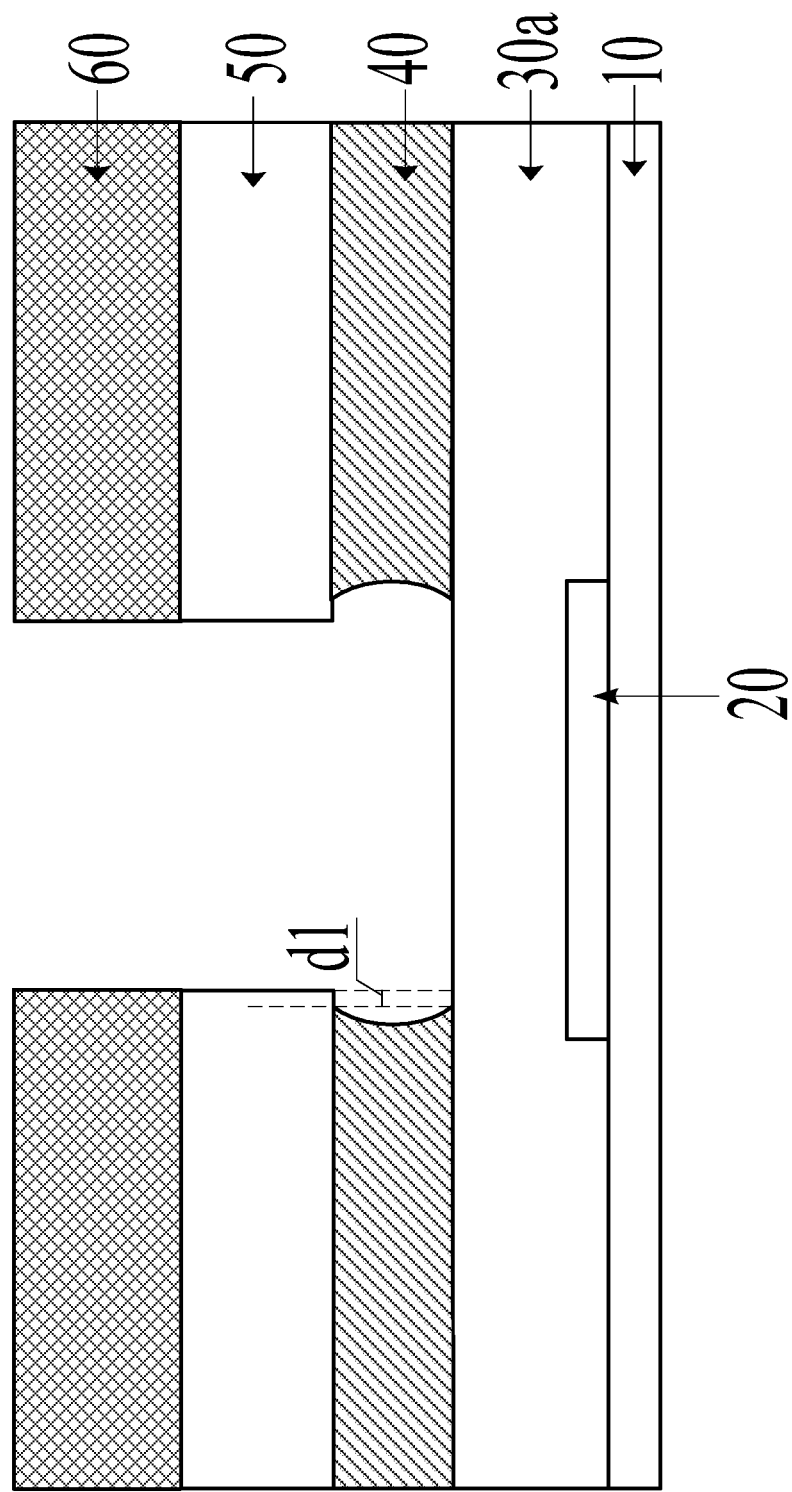
FIG. 17 is another schematic structural diagram after an auxiliary electrode pattern is formed according to an embodiment of the present disclosure.

It should be noted that when the auxiliary electrode pattern 40 is formed by the second etching, with respect to the auxiliary electrode pattern 40 and the first sub-defining layer 50 at the same opening position, at a contact position between the auxiliary electrode pattern 40 and the first sub-defining layer 50, an end face of the side face of the auxiliary electrode pattern 40 close to the opening may coincide with an end face of the side face the first sub-defining layer 50 close to the opening (for example, as illustrated in FIG. 16), or these two end faces may not coincide with each other. When the end face of the side face of the auxiliary electrode pattern 40 close to the opening does not coincide with the end face of the side face of the first sub-defining layer 50 close to the opening, referring to FIG. 17, the distance d1 between the two end faces may be 0.5~3 μm. That is, along the direction of the contact surface between the auxiliary electrode pattern and the first sub-defining layer, the maximum distance d1 from the side face of the auxiliary electrode pattern close to the opening to the side face of the first sub-defining layer close to the opening may be 0.5~3 μm. In an optional implementation, the distance d1 between the two end faces may be controlled by controlling an over-etching amount of the second etching.

In step 3045, a third etching is performed on the second sub-defining layer thin film to form a second sub-defining layer, and a pixel defining structure including the second pixel defining layer, the auxiliary electrode pattern and the first sub-defining layer is obtained.

The third etching may be performed on the second sub-defining layer thin film to form a second sub-defining layer whose surface away from a side of the substrate is covered by the photoresist pattern, the first sub-defining layer and the auxiliary electrode pattern. A plurality of openings are formed in the second sub-defining layer. The plurality of openings on the second sub-defining layer all pass through the openings on the first sub-defining layer in a one-to-one correspondence, and pass through the openings on the auxiliary electrode pattern in a one-to-one correspondence. In this case, the first sub-defining layer, the auxiliary electrode pattern and the second sub-defining layer may form a pixel defining layer. The pixel defining layer has a plurality of openings. The plurality of openings all pass through the first sub-defining layer, the auxiliary electrode pattern and the second sub-defining layer. In addition, the orthographic projection of the auxiliary electrode pattern on the substrate and the orthographic projection of the first sub-defining layer on the substrate may both fall within the orthographic projection of the second sub-defining layer on the substrate.

Figure 18:
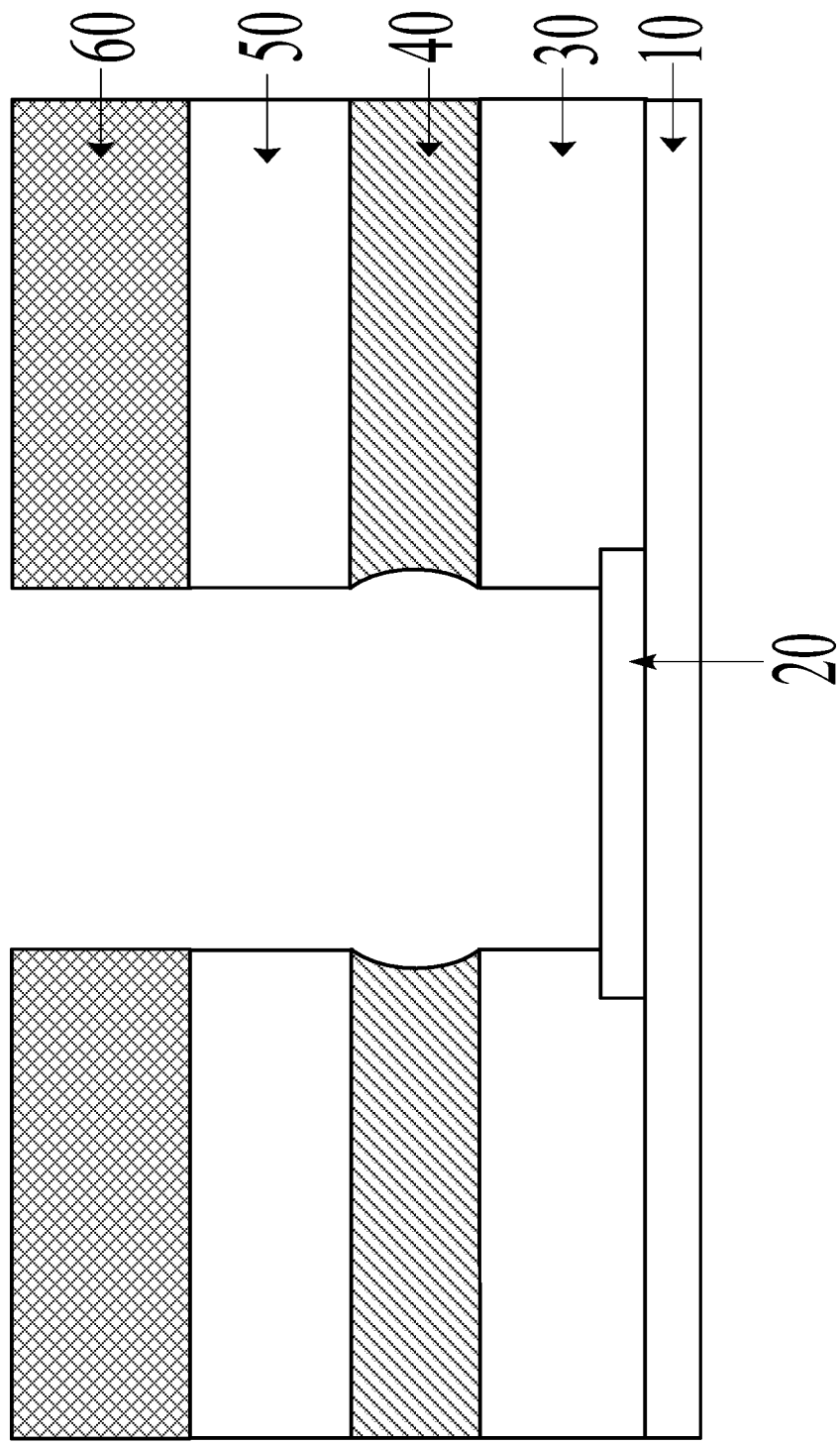
FIG. 18 is a schematic structural diagram after a second sub-defining layer is formed according to an embodiment of the present disclosure.

Exemplarily, referring to FIG. 18, FIG. 18 is a schematic structural diagram after a second sub-defining layer 30 is formed according to an embodiment of the present disclosure. The surface of the auxiliary electrode pattern 40 away from a side of the substrate is covered by the auxiliary electrode pattern 40, the first sub-defining layer 50 and the photoresist pattern 60 in sequence. A plurality of openings in the pixel defining layer all pass through the first sub-defining layer 50, the auxiliary electrode pattern 40 and the second sub-defining layer 30.

Optionally, the third etching may be a dry etching or a wet etching. It should be noted that when the third etching is the dry etching, as the lateral etching rate of etching an organic material is smaller than the lateral etching rate of etching a metal material, after the second sub-defining layer is formed by the wet etching, with respect to the auxiliary electrode pattern, the first sub-defining layer and the second sub-defining layer at the same opening position, the side face of the auxiliary electrode pattern close to the opening is recessed along the direction away from the opening. That is, relative to the side face of the second sub-defining layer close to the opening and the side face of the first sub-defining layer close to the opening, the side face of the auxiliary electrode pattern close to the opening is recessed along the direction away from the opening. Exemplarily, the side face of the auxiliary electrode pattern close to the opening may be recessed to be in an arc shape along the direction away from the opening.

Figure 19:
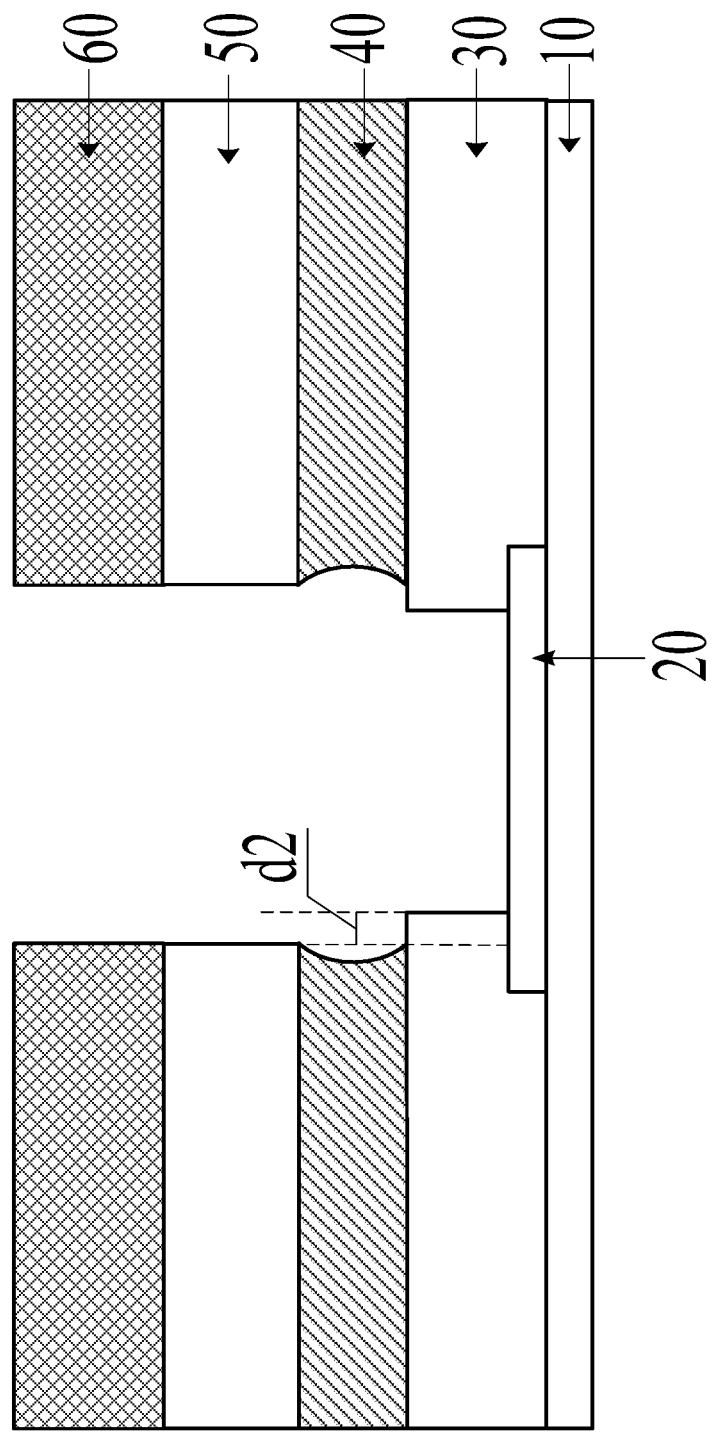
FIG. 19 is another schematic structural diagram after a second sub-defining layer is formed according to an embodiment of the present disclosure.

It should be noted that when the second sub-defining layer 30 is formed by the third etching, with respect to the auxiliary electrode pattern 40 and the second sub-defining layer 30 at the same opening position, at the contact position between the auxiliary electrode pattern 40 and the second sub-defining layer 30, the end face of the side face of the auxiliary electrode pattern 40 close to the opening may coincide with the end face of the side face of the second sub-defining layer 30 close to the opening (for example, as illustrated in FIG. 18), or these two end faces may not coincide with each other. When the end face of the side face of the auxiliary electrode pattern 40 close to the opening does not coincide with the end face of the side face of the second sub-defining layer 30 close to the opening, referring to FIG. 19, the distance d2 between the two end faces may be 0.5~3 µm. That is, along the direction of the contact surface between the auxiliary electrode pattern 40 and the second sub-defining layer 30, the maximum distance d2 from the side face of the second sub-defining layer 30 close to the opening to the side face of the auxiliary electrode pattern 40 close to the opening may be 0.5~3 µm. In an optional implementation, the distance d2 between the two end faces may be controlled by controlling an over-etching amount of the third etching.

In step 3064, the photoresist pattern is removed.

Figure 20:
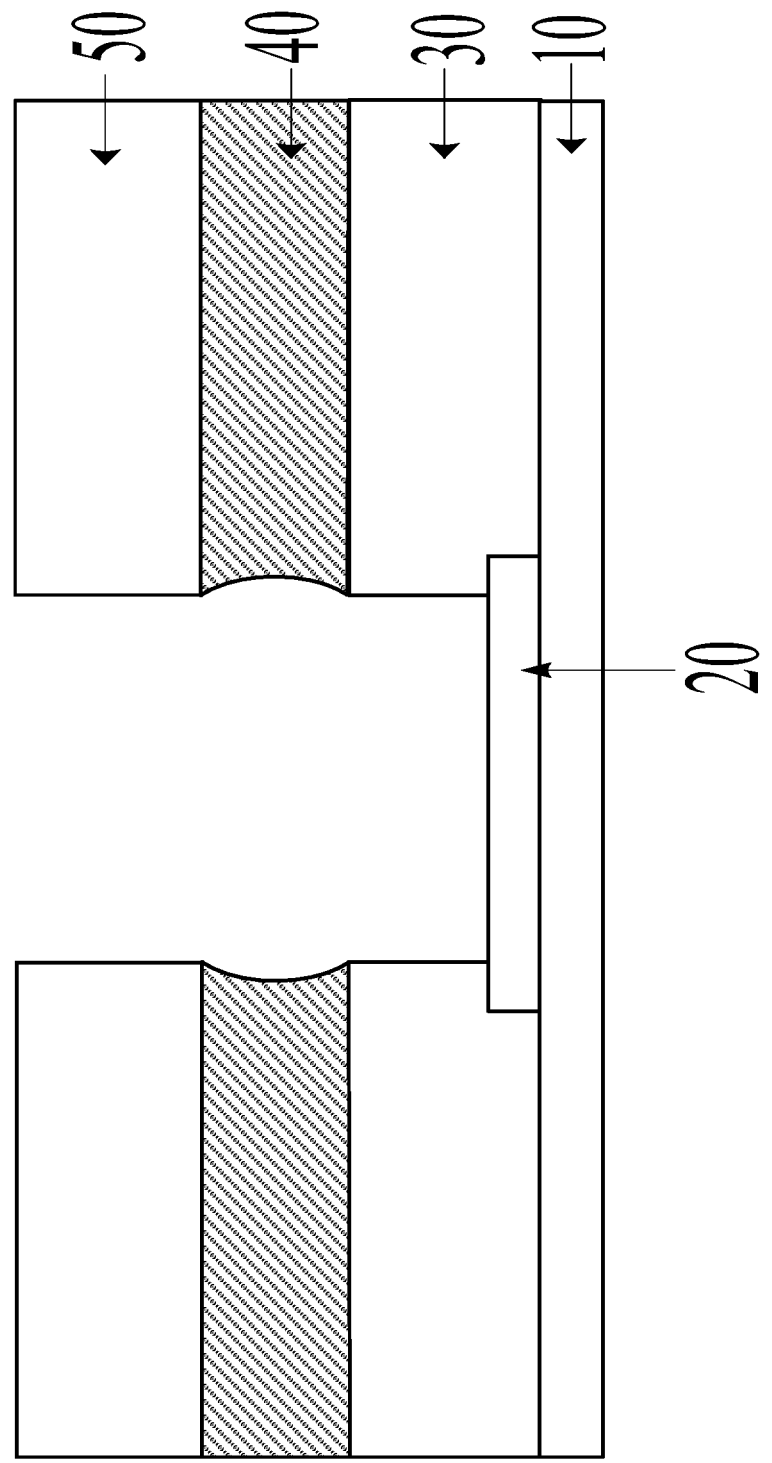
FIG. 20 is a schematic structural diagram of a pixel defining layer according to an embodiment of the present disclosure.

Exemplarily, referring to FIG. 20, FIG. 20 is a schematic structural diagram after the photoresist pattern 60 is removed according to an embodiment of the present disclosure. After the photoresist pattern is stripped off, the second sub-defining layer 30, the auxiliary electrode pattern 40 and the first sub-defining layer 50 may be formed. The second sub-defining layer 30, the auxiliary electrode pattern 40 and the first sub-defining layer 50 may form a pixel defining structure.

An embodiment of the present disclosure further provides a method of manufacturing a display panel. The method may include the following steps.

In step 401, anodes are formed on a substrate.

Optionally, an anode thin film may be formed on the substrate by any means of deposition, coating, sputtering and the like, and a one-time patterning process is performed on the anode thin film to form anodes. This one-time patterning process may include: photoresist coating, exposure, development, etching and photoresist stripping. The material of the anode may include a metal material having a high reflectivity. For example, the material of the anode may be silver (Ag), titanium (Ti), copper (Cu), aluminum (Al) or an alloy material. Exemplarily, referring to FIG. 11, FIG. 11 is a schematic structural diagram after the anodes 20 are formed on the substrate 10 according to an embodiment of the present disclosure.

In step 402, a pixel defining layer is formed on the substrate where the anodes are formed.

The way for implementing step 402 may be made reference to the method of manufacturing a pixel defining layer according to the foregoing-described embodiments.

In addition, before the second sub-defining layer thin film is formed on the substrate where the anodes are formed, the anodes may also be cleaned to remove an oxide layer on the surface of the anodes to ensure electrical properties of the anodes. A part of the anode may be covered by the second sub-defining layer in the pixel defining layer.

In step 403, a light emitting layer and a conductive material layer are formed in sequence in each opening.

The light emitting layer may be formed in each opening by an inkjet printing process or an evaporation process, and then the conductive material layer is formed on the light emitting layer by inkjet printing technology. Optionally, the material of the conductive material layer may include organic conductive solvent doped with a metal material, or conductive ink. In addition, the thickness of the light emitting layer may be set based on actual needs. For example, the thickness of the light emitting layer may be such set that the vertical distance from a surface of the light emitting layer away from a side of the substrate to the substrate is less than or equal to the vertical distance from a surface of the second sub-defining layer away from a side of the substrate to the substrate. Exemplarily, referring to FIG. 7, FIG. 7 is a schematic structural diagram after a light emitting layer 70 and a conductive material layer 80 are formed according to an embodiment of the present disclosure.

It should be noted that when the light emitting layer is formed by the evaporation process, a light emitting layer may also be formed on the surface of the first sub-defining layer away from the substrate. However, the light emitting layer on the surface of the first sub-defining layer away from the substrate is only connected to a cathode formed subsequently later, but is not connected to the anodes. Therefore, even if the light emitting layer is formed on the surface of the first sub-defining layer away from the substrate, the light emitting layer does not emit light. Thus, the light emitting effect of the display device is not affected. In addition, as the first sub-defining layer shields the auxiliary electrode pattern, the light emitting layer is not in contact with the auxiliary electrode pattern.

In step 404, a cathode is formed on the substrate where the conductive material layer is formed.

Optionally, a cathode thin film may be formed by any means of deposition, coating, sputtering and the like on the substrate where the conductive material layer is formed, and a one-time patterning process is performed on the cathode thin film to form a cathode. The one-time patterning process may include: photoresist coating, exposure, development, etching and photoresist stripping. Optionally, the material of the cathode may include a transparent conductive material. For example, the transparent conductive material includes indium tin oxide (ITO). Exemplarily, referring to FIG. 8, FIG. 8 is a schematic structural diagram after a cathode 90 is formed according to an embodiment of the present disclosure. The cathode 90 is electrically connected to the auxiliary electrode pattern 40 via the conductive material layer 80.

In summary, with the method of manufacturing a display panel according to the embodiment of the present disclosure, since the auxiliary electrode pattern and the first sub-defining layer in the pixel defining layer in the display panel are obtained by forming the auxiliary electrode pattern thin film and the first sub-defining layer thin film sequentially on the substrate, and then patterning the first sub-defining layer thin film and the auxiliary electrode pattern thin film. In addition, the orthographic projection of the auxiliary electrode pattern on the substrate is within the orthographic projection of the first sub-defining layer on the substrate. Therefore, when the light emitting layer is formed in the opening of the pixel defining layer, the first sub-defining layer can shield the auxiliary electrode pattern, to prevent the material of the light emitting layer from being attached to the auxiliary electrode pattern. Thus, the electrical connection performance between the auxiliary electrode pattern and the cathode is improved, and the display effect of the display panel manufactured by using the pixel defining layer is enhanced.

Persons skilled in the art would clearly acknowledge that for the convenience and conciseness of description, the structural features of the above described display panel may be made reference to the corresponding structural features in the foregoing-described embodiments of the method of manufacturing a display panel, and details are not repeated here.

Persons of ordinary skill in the art could understand that all or part of steps in the above-described embodiments may be implemented by hardware or relevant hardware instructed by programs. The programs may be stored in a non-transitory computer-readable storage medium. The storage medium may be a read only memory, a magnetic disk, or a compact disk.

What is claimed is:

1. A pixel defining layer, comprising:
an auxiliary electrode pattern, on a side of a substrate and configured to be electrically connected to a cathode in a display panel; and
a first sub-defining layer on a side of the auxiliary electrode pattern away from the substrate;
wherein the pixel defining layer has a plurality of openings, the plurality of openings passing through the auxiliary electrode pattern and the first sub-defining layer, the openings being configured to accommodate a material of a light emitting layer, an orthographic projection of the auxiliary electrode pattern on the substrate being within an orthographic projection of the first sub-defining layer on the substrate; and
wherein a longitudinal section of each of the plurality of openings has a rectangle shape, and a side face of the auxiliary electrode pattern close to the openings is recessed along a direction away from the openings, such that the material of the light emitting layer is prevented from being in contact with the auxiliary electrode pattern during a process of manufacturing the light emitting layer.

2. The pixel defining layer according to claim 1, wherein the side face of the auxiliary electrode pattern close to the openings is recessed to be in an arc shape along the direction away from the openings.

3. The pixel defining layer according to claim 1, wherein in a direction of a contact surface between the auxiliary electrode pattern and the first sub-defining layer, a maximum distance from the side face of the auxiliary electrode pattern close to a side face of the first sub-defining layer close to the openings is 0.5~3 μm.

4. The pixel defining layer according to claim 1, further comprising: a second sub-defining layer, wherein the second sub-defining layer is between the substrate and the auxiliary electrode pattern, and the plurality of openings pass through the second sub-defining layer.

5. The pixel defining layer according to claim 4, wherein the orthographic projection of the auxiliary electrode pattern and the orthographic projection of the first sub-defining layer on the substrate both are within an orthographic projection of the second sub-defining layer on the substrate.

6. The pixel defining layer according to claim 4, wherein in a direction of a contact surface between the auxiliary electrode pattern and the second sub-defining layer, a maximum distance from a side face of the second sub-defining layer close to the openings to the side face of the auxiliary electrode pattern close to the opening is 0.5~3 μm.

7. The pixel defining layer according to claim 4, wherein the second sub-defining layer has a thickness of 300~2000 nm, the auxiliary electrode pattern has a thickness of 10~700 nm, and the first sub-defining layer has a thickness of 300~2000 nm.

8. The pixel defining layer according to claim 1, wherein a material of the auxiliary electrode pattern comprises a metal material.

9. A display panel, comprising a pixel defining layer; wherein the pixel defining layer comprises:
an auxiliary electrode pattern, on a side of a substrate and configured to be electrically connected to a cathode in the display panel; and
a first sub-defining layer on a side of the auxiliary electrode pattern away from the substrate;
wherein the pixel defining layer has a plurality of openings, the plurality of openings passing through the auxiliary electrode pattern and the first sub-defining layer, the openings being configured to accommodate a material of a light emitting layer, an orthographic projection of the auxiliary electrode pattern on the substrate being within an orthographic projection of the first sub-defining layer on the substrate; and
wherein a longitudinal section of each of the plurality of openings has a rectangle shape, and a side face of the auxiliary electrode pattern close to the openings is recessed along a direction away from the openings, such that the material of the light emitting layer is prevented from being in contact with the auxiliary electrode pattern during a process of manufacturing the light emitting layer; and
the display panel further comprising:
a conductive material layer in at least one of the plurality of openings, the conductive material layer being electrically connected to the auxiliary electrode pattern.

10. The display panel according to claim 9, further comprising: a cathode, wherein the cathode is on a side of the first sub-defining layer and the conductive material layer away from the substrate, and the cathode is electrically connected to the conductive material layer.

11. The display panel according to claim 9, further comprising: a light emitting layer and anodes, wherein the light emitting layer is between the anodes and the conductive material layer.

12. The display panel according to claim 11, wherein the anode is in the opening, and the anode is partially covered by a second sub-defining layer.

13. The display panel according to claim 11, wherein the light emitting layer is not in contact with the auxiliary electrode pattern.

14. The display panel according to claim 11, wherein a vertical distance from a surface of the light emitting layer away from a side of the substrate to the substrate is less than or equal to a vertical distance from a surface of a second sub-defining layer away from the side of the substrate to the substrate.

15. The display panel according to claim 9, wherein
a material of the conductive material layer comprises any one of organic conductive solvent doped with a metal material, and conductive ink.

16. A method of manufacturing a pixel defining layer, comprising:
forming an auxiliary electrode pattern thin film on a side of a substrate;
forming a first sub-defining layer thin film on a side of the auxiliary electrode pattern away from the substrate; and
patterning the first sub-defining layer thin film and the auxiliary electrode pattern thin film to form an auxiliary electrode pattern and a first sub-defining layer, the auxiliary electrode pattern being configured to be electrically connected to a cathode in a display panel;
wherein the pixel defining layer has a plurality of openings, the plurality of openings all passing through the auxiliary electrode pattern and the first sub-defining layer, the openings being configured to accommodate a material of a light emitting layer, an orthographic projection of the auxiliary electrode pattern on the substrate being within an orthographic projection of the first sub-defining layer on the substrate; and
wherein a longitudinal section of each of the plurality of openings has a rectangle shape, and a side face of the auxiliary electrode pattern close to the openings is recessed along a direction away from the openings, such that the material of the light emitting layer is prevented from being in contact with the auxiliary electrode pattern during a process of manufacturing the light emitting layer.

17. The method according to claim 16, wherein
patterning the first sub-defining layer thin film and the auxiliary electrode pattern thin film to form an auxiliary electrode pattern and a first sub-defining layer comprises:
defining a photoresist thin film on a side of the first sub-defining layer thin film away from the substrate;
patterning the photoresist thin film to form a photoresist pattern;
performing a first etching on the first sub-defining layer thin film by using the photoresist pattern to form a first sub-defining layer whose surface is covered with the photoresist pattern;
performing a second etching on the auxiliary electrode pattern thin film to form an auxiliary electrode pattern whose surface is covered with the photoresist pattern and the first sub-defining layer; and
removing the photoresist pattern to obtain the auxiliary electrode pattern and the first sub-defining layer.

18. The method according to claim 17, wherein
a lateral etching strength of the second etching is greater than a lateral etching strength of the first etching.

19. The method according to claim 16, wherein prior to forming an auxiliary electrode pattern thin film on a side of a substrate, the method further comprises:
forming a second sub-defining layer thin film on a side of the substrate;
forming an auxiliary electrode pattern thin film on a side of a substrate comprises:
forming the auxiliary electrode pattern thin film on a side of the second sub-defining layer thin film away from the substrate; and
patterning the first sub-defining layer thin film and the auxiliary electrode pattern thin film to form an auxiliary electrode pattern and a first sub-defining layer comprises: patterning the first sub-defining layer thin film, the auxiliary electrode pattern thin film and the second sub-defining layer thin film to form a second sub-defining layer, the auxiliary electrode pattern and the first sub-defining layer, such that the plurality of openings pass through the second sub-defining layer, the auxiliary electrode pattern and the first sub-defining layer.

* * * * *